United States Patent
Liaptsis et al.

(10) Patent No.: US 12,302,755 B2
(45) Date of Patent: May 13, 2025

(54) ORGANIC ELECTROLUMINESCENT DEVICE EMITTING BLUE LIGHT

(71) Applicant: Samsung Display Co., Ltd., Yongin-si (KR)

(72) Inventors: Georgios Liaptsis, Mannheim (DE); Christian Kasparek, Heidelberg (DE); Harald Fluegge, Karlsruhe (DE); Sandra Bonus, Cologne (DE); Patrick Pingel, Potsdam (DE); Jaime Leganes Carballo, Heidelberg (DE); Irina Roerich, Mannheim (DE)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/501,882

(22) Filed: Nov. 3, 2023

(65) Prior Publication Data

US 2024/0107882 A1   Mar. 28, 2024

Related U.S. Application Data

(63) Continuation of application No. 17/937,348, filed on Sep. 30, 2022, now Pat. No. 11,844,276, which is a continuation of application No. 16/597,343, filed on Oct. 9, 2019, now Pat. No. 11,508,916.

(30) Foreign Application Priority Data

Oct. 15, 2018 (EP) .................... 18200460

(51) Int. Cl.
*H10K 50/00* (2023.01)
*H10K 85/40* (2023.01)
*H10K 85/60* (2023.01)
*H10K 101/30* (2023.01)

(52) U.S. Cl.
CPC ......... *H10K 85/6572* (2023.02); *H10K 50/00* (2023.02); *H10K 85/40* (2023.02); *H10K 85/654* (2023.02); *H10K 2101/30* (2023.02)

(58) Field of Classification Search
None
See application file for complete search history.

(56) References Cited

U.S. PATENT DOCUMENTS

| | | | |
|---|---|---|---|
| 11,239,428 B2 | 2/2022 | Huang et al. | |
| 11,844,276 B2 * | 12/2023 | Liaptsis | H10K 50/00 |
| 2006/0279204 A1 | 12/2006 | Forrest et al. | |
| 2011/0291082 A1 | 12/2011 | Terao et al. | |
| 2013/0161590 A1 | 6/2013 | Yun et al. | |
| 2015/0340623 A1 | 11/2015 | Kawamura et al. | |
| 2016/0111660 A1 | 4/2016 | Yang et al. | |
| 2016/0190478 A1 | 6/2016 | Nakanotani et al. | |
| 2016/0315268 A1 | 10/2016 | Stoessel | |
| 2016/0380205 A1 | 12/2016 | Adachi et al. | |
| 2017/0062731 A1 | 3/2017 | Ogiwara et al. | |
| 2017/0084844 A1 | 3/2017 | Parham et al. | |
| 2017/0141323 A1 | 5/2017 | Miyazaki et al. | |
| 2017/0163010 A1 | 6/2017 | Nakanotani et al. | |
| 2017/0194585 A1 | 7/2017 | Yan | |
| 2017/0250363 A1 | 8/2017 | Baumann et al. | |
| 2017/0320855 A1 | 11/2017 | Wong et al. | |
| 2017/0369773 A1 | 12/2017 | Parham et al. | |
| 2018/0062085 A1 | 3/2018 | Bergmann et al. | |
| 2018/0062086 A1 | 3/2018 | Fabio et al. | |
| 2018/0123049 A1 | 5/2018 | Lee et al. | |
| 2018/0134686 A1 | 5/2018 | Bergmann | |
| 2018/0323394 A1 | 11/2018 | Haldi et al. | |
| 2018/0323395 A1 | 11/2018 | Haldi et al. | |
| 2019/0058130 A1 | 2/2019 | Aguilera-Iparraguirre et al. | |
| 2019/0157570 A1 | 5/2019 | Sim et al. | |
| 2019/0259959 A1 | 8/2019 | Duan et al. | |
| 2019/0334097 A1 | 10/2019 | Sugawara et al. | |
| 2019/0345095 A1 | 11/2019 | Adachi et al. | |
| 2020/0106023 A1 | 4/2020 | Zhang et al. | |
| 2021/0050546 A1 | 2/2021 | Li et al. | |
| 2021/0135119 A1 | 5/2021 | Cheng et al. | |
| 2021/0155849 A1 | 5/2021 | Stubbs et al. | |
| 2021/0202864 A1 | 7/2021 | Nakanotani et al. | |
| 2021/0305517 A1 | 9/2021 | Suzuki et al. | |

FOREIGN PATENT DOCUMENTS

| | | |
|---|---|---|
| CN | 101156257 A | 4/2008 |
| CN | 105074950 A | 11/2015 |
| CN | 105103326 A | 11/2015 |
| CN | 106103648 A | 11/2016 |

(Continued)

OTHER PUBLICATIONS

Jing, Yi-Ming, You-Xuan Zheng, and Jing-Lin Zuo. "Efficient green electroluminescence based on an iridium (III) complex with different device structures." RSC advances 7.5 (2017): 2615-2620. (Year: 2017).*

(Continued)

*Primary Examiner* — Robert S Loewe
(74) *Attorney, Agent, or Firm* — Womble Bond Dickinson (US) LLP

(57) ABSTRACT

The present invention relates to organic electroluminescent devices comprising a light-emitting layer B comprising a host material $H^B$, a first thermally activated delayed fluorescence (TADF) material $E^B$, and a depopulation agent $S^B$.

19 Claims, No Drawings

(56) References Cited

FOREIGN PATENT DOCUMENTS

| CN | 106206997 | A | 12/2016 |
| CN | 109810045 | A | 5/2019 |
| CN | 110492006 | A | 11/2019 |
| EP | 2 610 937 | A1 | 7/2013 |
| EP | 2 958 158 | A1 | 12/2015 |
| EP | 3 144 997 | A1 | 3/2017 |
| EP | 3 171 421 | A1 | 5/2017 |
| EP | 3 490 023 | A1 | 5/2019 |
| JP | 2002-050483 | A | 2/2002 |
| JP | 2013-135237 | A | 7/2013 |
| JP | 2015-144224 | A | 8/2015 |
| JP | 2015-179809 | A | 10/2015 |
| JP | 2018-065784 | A | 4/2018 |
| JP | 2018-070586 | A | 5/2018 |
| JP | 2018-080161 | A | 5/2018 |
| JP | 2019-96876 | A | 6/2019 |
| KR | 10-2016-0045572 | A | 4/2016 |
| KR | 10-2016-0064956 | A | 6/2016 |
| KR | 10-2017-0036706 | A | 4/2017 |
| KR | 10-2018-0048412 | A | 5/2018 |
| WO | WO 2011/030450 | A1 | 3/2011 |
| WO | WO 2014/104315 | A1 | 7/2014 |

OTHER PUBLICATIONS

Huang, Manli, et al. "Carbazole-dendronized thermally activated delayed fluorescent molecules with small singlet-triplet gaps for solution-processed organic light-emitting diodes." Dyes and Pigments 153 (2018): 92-98. (Year: 2018).*

Song, Wook, Inho Lee, and Jun Yeob Lee. "Host Engineering for High Quantum Efficiency Blue and White Fluorescent Organic Light-Emitting Diodes." Advanced Materials (Deerfield Beach, Fla.) 27.29 (2015): 4358-4363. (Year: 2015).*

Liu, Wei, et al. "High performance all fluorescence white organic light emitting devices with a highly simplified structure based on thermally activated delayed fluorescence dopants and host." ACS Applied Materials & Interfaces 8.48 (2016): 32984-32991. (Year: 2015).*

HoáLee, In, and Jun YeobaLee. "High efficiency blue fluorescent organic light-emitting diodes using a conventional blue fluorescent emitter." Journal of Materials Chemistry C 3.34 (2015): 8834-8838. (Year: 2015).*

Bui et al.; "Recent advances on organic blue thermally activated delayed fluorescence (TADF) emitters for organic light-emitting diodes (OLEDs)"; Beilstein journal of organic chemistry 14; No. 1; (2018); pp. 282-308. (Year: 2018).

Excerpt from the homepage of Prof. Dr. Hartmut Yersin of Dec. 21, 2020 regarding the topic "Triplet Emitters and Control of Emission Properties".

Han et al.; "Ideal blue thermally activated delayed fluorescence emission assisted by a thermally activated delayed fluorescence assistant dopant through a fast reverse intersystem crossing mediated cascade energy transfer process"; Journal of Materials of Chemistry 7(10); 2019; pp. 3082-3089. (Year: 2019).

Thesis ("proefschrift") of Dorothee Wasserberg "Triplet states—triplet fates: phosphorescence and energy transfer in functional molecules"; Eindhoven University of Technology, published on Jan. 1, 2006.

Notice of Allowance for KR Patent Application No. 10-2019-0127183 dated Sep. 2, 2024, 3pp.

* cited by examiner

ORGANIC ELECTROLUMINESCENT DEVICE EMITTING BLUE LIGHT

CROSS-REFERENCE TO RELATED APPLICATION

This application is a continuation of U.S. patent application Ser. No. 17/937,348, filed Sep. 30, 2022, which is a continuation of U.S. patent application Ser. No. 16/597,343, filed Oct. 9, 2019, now U.S. Pat. No. 11,508,916, which claims priority to and the benefit of European Patent Application No. 18200460.6, filed on Oct. 15, 2018, the entire content of which is incorporated by reference.

BACKGROUND

1. Field

The present invention relates to organic electroluminescent devices comprising a light-emitting layer B comprising a host material $H^B$, a first thermally activated delayed fluorescence (TADF) material $E^B$, and a depopulation agent $S^B$.

2. Description of Related Art

Organic electroluminescent devices containing one or more light-emitting layers based on organics such as, e.g., organic light emitting diodes (OLEDs), light emitting electrochemical cells (LECs) and light-emitting transistors gain increasing importance. In particular, OLEDs are promising devices for electronic products such as e.g. screens, displays and illumination devices. In contrast to most electroluminescent devices essentially based on inorganics, organic electroluminescent devices based on organics are often rather flexible and producible in particularly thin layers. The OLED-based screens and displays already available today bear particularly beneficial brilliant colors, contrasts and are comparably efficient with respect to their energy consumption.

A central element of an organic electroluminescent device for generating light is a light-emitting layer placed between an anode and a cathode. When a voltage (and current) is applied to an organic electroluminescent device, holes and electrons are injected from an anode and a cathode, respectively, to the light-emitting layer. Typically, a hole transport layer is located between light-emitting layer and the anode, and an electron transport layer is located between light-emitting layer and the cathode. The different layers are sequentially disposed. Excitons of high energy are then generated by recombination of the holes and the electrons. The decay of such excited states (e.g., singlet states such as S1 and/or triplet states such as T1) to the ground state (S0) desirably leads to light emission.

In order to enable efficient energy transport and emission, an organic electroluminescent device comprises one or more host compounds and one or more emitter compounds as dopants.

Challenges when generating organic electroluminescent devices are thus the improvement of the illumination level of the devices (i.e., brightness per current), obtaining a desired light spectrum and achieving suitable (long) lifespans.

It has been tried to admix electron trap materials to the light-emitting layers to enhance lifespan (EP-A 2610937). Herein, the electron trap materials have a lowest unoccupied molecular orbital LUMO and a highest occupied molecular orbital HOMO, which are both lower than the LUMOs and HOMOs of the dopant (a conventional fluorescent emitter) and the host. This mixture however is comparably inefficient. Thus, the dopant is usable at very low concentrations only, while the electron trap materials are used in excess to the dopant.

There is still a lack of efficient and stable OLEDs that emit in the deep blue region of the visible light spectrum, which would be expressed by a small $CIE_y$ value. Accordingly, there is still the unmet technical need for organic electroluminescent devices which have a long lifetime and high quantum yields, in particular in the deep blue range.

Surprisingly, it has been found that an organic electroluminescent device's light-emitting layer comprising one thermally activated delayed fluorescence (TADF) emitter, a depopulation agent and a host material provides an organic electroluminescent device having good lifetime and quantum yields, particular despite exhibiting deep blue emission.

Accordingly, one aspect of the present invention relates to an organic electroluminescent device which comprises a light-emitting layer B comprising:
 (i) a host material $H^B$, which has a lowest unoccupied molecular orbital $LUMO(H^B)$ having an energy $E^{LUMO}(H^B)$ and a highest occupied molecular orbital $HOMO(H^B)$ having an energy $E^{HOMO}(H^B)$;
 (ii) a first thermally activated delayed fluorescence (TADF) material $E^B$, which has a lowermost excited singlet state energy level $S1^E$, a lowermost excited triplet state energy level $T1^E$, a lowest unoccupied molecular orbital $LUMO(E^B)$ having an energy $E^{LUMO}(E^B)$ and a highest occupied molecular orbital $HOMO(E^B)$ having an energy $E^{HOMO}(E^B)$; and
 (iii) an depopulation agent $S^B$, which has a lowermost excited singlet state energy level $S1^S$, a lowermost excited triplet state energy level $T1^S$, a lowest unoccupied molecular orbital $LUMO(S^B)$ having an energy $E^{LUMO}(S^B)$ and a highest occupied molecular orbital $HOMO(S^B)$ having an energy $E^{HOMO}(S^B)$,
 wherein $E^B$ emits thermally activated delayed fluorescence; and wherein the relations expressed by the following formulas (1) to (2) and either (3a) and (3b) or (4a) and (4b) apply:

$$S1^S \geq S1^E \tag{1}$$

$$T1^S \geq 2.5 \text{ eV} \tag{2}$$

$$E^{LUMO}(E^B) < E^{LUMO}(H^B) \tag{3a}$$

$$0.2 \text{ eV} < E^{LUMO}(E^B) - E^{LUMO}(S^B) < 0.5 \text{ eV} \tag{3b}$$

$$E^{LUMO}(E^B) > E^{LUMO}(H^B) \tag{4a}$$

$$0.2 \text{ eV} < E^{LUMO}(H^B) - E^{LUMO}(S^B) < 0.5 \text{ eV} \tag{4b}$$

According to the invention, the lowermost excited singlet state energy level $S1^S$ of the depopulation agent $S^B$ is higher or equal in energy than the lowermost excited singlet state energy level $S1^E$ of the thermally activated delayed fluorescence (TADF) material $E^B$. The lowermost excited triplet state energy level $T1^S$ of the depopulation agent $S^B$ is larger than or equal to 2.5 eV. In one aspect of the invention, the lowest unoccupied molecular orbital of the host material $H^B$ is higher in energy than the lowest unoccupied molecular orbital of the TADF material $E^B$ (i.e. the TADF material $E^B$ acts as the main electron transporting material).

In this aspect, the lowest unoccupied molecular orbital of the depopulation agent $S^B$ is lower in energy than the lowest unoccupied molecular orbital of the TADF material $E^B$ by at least 0.2 eV and by 0.5 eV at the maximum, in particular by at least 0.25 eV and by 0.4 eV at the maximum.

In an alternative aspect of the invention, the lowest unoccupied molecular orbital of the host material $H^B$ is lower in energy than the lowest unoccupied molecular orbital of the TADF material $E^B$ (i.e. the host material $H^B$ acts as the main electron transporting material). In this aspect, the lowest unoccupied molecular orbital of the depopulation agent $S^B$ is lower in energy than the lowest unoccupied molecular orbital of the host material $H^B$ by at least 0.2 eV and by 0.5 eV at the maximum, in particular by at least 0.25 eV and by 0.4 eV at the maximum.

In both aspects of the invention, the lowest unoccupied molecular orbital of the depopulation agent $S^B$ is lower in energy than the lowest unoccupied molecular orbital of the main electron transporting material by at least 0.2 eV and by 0.5 eV at the maximum, in particular by at least 0.25 eV and by 0.4 eV at the maximum.

In one embodiment of the invention, the lowermost excited triplet state energy level $T1^S$ of the depopulation agent $S^B$ is between 2.5 eV and 3.5 eV, preferably between 2.6 eV and 3.2 eV, more preferably between 2.7 eV and 3.1 eV or even between 2.8 eV and 3.0 eV.

In a preferred embodiment, the relation expressed by the formulas (3a) and (3b) apply. In an alternative preferred embodiment, the relation expressed by the formulas (4a) and (4b) apply.

In one embodiment of the invention, the mass ratio of TADF material to depopulation agent ($E^B:S^B$) is >1. In one embodiment of the invention, the mass ratio $E^B:S^B$ is in the range of 1.5:1 to 20:1, in the range of 2:1 to 10:1, or in the range of 3:1 to 5:1. For example, the mass ratio $E^B:S^B$ is in the range of (approximately) 3:1, 4:1, 5:1 or 6:1.

In one embodiment, the relation expressed by the following formula (5a) applies:

$$E^{HOMO}(E^B) > E^{HOMO}(H^B) \quad (5a).$$

In another embodiment, the relation expressed by the following formula (5b) applies:

$$E^{HOMO}(E^B) < E^{HOMO}(H^B) \quad (5b).$$

In an embodiment of the present invention, the relations expressed by the following formulae (3a) and (5a) both apply:

$$E^{LUMO}(E^B) < E^{LUMO}(H^B) \quad (3a); \text{ and}$$

$$E^{HOMO}(E^B) > E^{HOMO}(H^B) \quad (5a).$$

In an embodiment of the present invention, the relations expressed by the following formulae apply:

$$E^{LUMO}(E^B) < E^{LUMO}(H^B) > E^{LUMO}(S^B); \text{ and}$$

$$E^{HOMO}(E^B) > E^{HOMO}(H^B) > E^{HOMO}(S^B).$$

In an alternative embodiment of the present invention, the relations expressed by the following formulae (4a) and (5b) both apply:

$$E^{LUMO}(E^B) > E^{LUMO}(H^B) \quad (4a); \text{ and}$$

$$E^{HOMO}(E^B) < E^{HOMO}(H^B) \quad (5b).$$

In an embodiment of the present invention, the relations expressed by the following formulae apply:

$$E^{LUMO}(E^B) > E^{LUMO}(H^B) > E^{LUMO}(S^B); \text{ and}$$

$$E^{HOMO}(E^B) < E^{HOMO}(H^B) > E^{HOMO}(S^B).$$

In an embodiment of the present invention, the relations expressed by the following formulae apply:

$$E^{LUMO}(E^B) > E^{LUMO}(S^B); \text{ and}$$

$$E^{LUMO}(H^B) > E^{LUMO}(S^B).$$

In an embodiment of the present invention, the relations expressed by the following formulae apply:

$$E^{HOMO}(E^B) > E^{HOMO}(S^B); \text{ and}$$

$$E^{HOMO}(H^B) > E^{HOMO}(S^B).$$

In an embodiment of the present invention, all of the relations expressed by the following formulae apply:

$$E^{LUMO}(E^B) < E^{LUMO}(H^B);$$

$$E^{HOMO}(E^B) > E^{HOMO}(H^B);$$

$$E^{LUMO}(E^B) > E^{LUMO}(S^B);$$

$$E^{LUMO}(H^B) > E^{LUMO}(S^B);$$

$$E^{HOMO}(E^B) > E^{HOMO}(S^B); \text{ and}$$

$$E^{HOMO}(H^B) > E^{HOMO}(S^B).$$

In an embodiment of the present invention, the relations expressed by the following formulae apply:

$$E^{LUMO}(H^B) > E^{LUMO}(E^B) > E^{LUMO}(S^B); \text{ and}$$

$$E^{HOMO}(E^B) > E^{HOMO}(H^B) > E^{HOMO}(S^B).$$

In an embodiment of the present invention, the relation expressed by the following formula applies:

$$E^{LUMO}(H^B) > E^{LUMO}(E^B) > E^{LUMO}(S^B) > E^{HOMO}(E^B) > E^{HOMO}(H^B) > E^{HOMO}(S^B).$$

In an alternative embodiment of the present invention, all of the relations expressed by the following formulae apply:

$$E^{LUMO}(E^B) > E^{LUMO}(H^B);$$

$$E^{HOMO}(E^B) < E^{HOMO}(H^B);$$

$$E^{LUMO}(E^B) > E^{LUMO}(S^B);$$

$$E^{LUMO}(H^B) > E^{LUMO}(S^B);$$

$$E^{HOMO}(E^B) > E^{HOMO}(S^B); \text{ and}$$

$$E^{HOMO}(H^B) > E^{HOMO}(S^B).$$

In an embodiment of the present invention, the relations expressed by the following formulae apply:

$$E^{LUMO}(E^B) > E^{LUMO}(H^B) > E^{LUMO}(S^B); \text{ and}$$

$$E^{HOMO}(H^B) > E^{HOMO}(E^B) > E^{HOMO}(S^B).$$

In an embodiment of the present invention, the relation expressed by the following formula applies:

$$E^{LUMO}(E^B) > E^{LUMO}(H^B) > E^{LUMO}(S^B) > E^{HOMO}(H^B) > E^{HOMO}(E^B) > E^{HOMO}(S^B).$$

I.e. the highest occupied molecular orbital of the TADF material $E^B$ is lower in energy than the highest occupied molecular orbital of the host material $H^B$.

In one embodiment, the relation expressed by the following formula (6) applies:

$$E^{HOMO}(S^B) < E^{HOMO}(H^B) \quad (6)$$

I.e. the highest occupied molecular orbital of the depopulation agent $S^B$ is lower in energy than the highest occupied molecular orbital of the host material $H^B$.

In an alternative embodiment, $E^{HOMO}(S^B) > E^{HOMO}(H^B)$.

As used herein, the terms "TADF material" and "TADF emitter" may be understood interchangeably. When one of the terms "emitter" "emitter compound" or the like is used, this may be understood in that preferably a TADF material of the present invention is meant, in particular one or those designated as $E^B$ and $S^B$, respectively.

According to the present invention, a TADF material is characterized in that it exhibits a $\Delta E_{ST}$ value, which corresponds to the energy difference between the lowermost excited singlet state (S1) and the lowermost excited triplet state (T1), of less than 0.4 eV, preferably less than 0.3 eV, more preferably less than 0.2 eV, even more preferably less than 0.1 eV or even less than 0.05 eV.

Accordingly in an embodiment of the present invention, the TADF material $E^B$ is characterized in that it has a $\Delta E_{ST}$ value, which corresponds to the energy difference between $S1^E$ and $T1^E$, of less than 0.4 eV. In a preferred embodiment of the present invention, the TADF material $E^B$ is characterized in that it has a $\Delta E_{ST}$ value of less than 0.3 eV, less than 0.2 eV, less than 0.1 eV, or even less than 0.05 eV.

In one embodiment of the present invention, the depopulation agent $S^B$ is a TADF material, i.e., one or more TADF emitter. Accordingly in an embodiment of the present invention, the depopulation agent $S^B$ is characterized in that it has a $\Delta E_{ST}$ value, which corresponds to the energy difference between $S1^S$ and $T1^S$, of less than 0.4 eV. In a preferred embodiment of the present invention, the depopulation agent $S^B$ is characterized in that it has a $\Delta E_{ST}$ value of less than 0.3 eV, less than 0.2 eV, less than 0.1 eV, or even less than 0.05 eV.

In one embodiment of the present invention, the TADF material $E^B$ and the depopulation agent $S^B$ are both organic TADF emitters.

It will be understood that the light-emitting layer B may also comprise more than one TADF materials $E^B$ and/or more than one depopulation agents $S^B$ each having the properties as described herein. According to the present invention, the light-emitting layer B comprises at least one TADF material $E^B$ and at least one depopulation agent $S^B$ each having the properties as described herein. According to one embodiment of the present invention, the light-emitting layer B comprises one TADF material $E^B$ and one depopulation agent $S^B$ each having the properties as described herein.

As used herein, the terms organic electroluminescent device and opto-electronic light-emitting devices may be understood in the broadest sense as any device comprising a light-emitting layer B comprising a host material $H^B$, a TADF material $E^B$ and a depopulation agent $S^B$.

The organic electroluminescent device may be understood in the broadest sense as any device based on organic materials that is suitable for emitting light in the visible or nearest ultraviolet (UV) range, i.e., in the range of a wavelength of from 380 to 800 nm. More preferably, organic electroluminescent device may be able to emit light in the visible range, i.e., of from 400 to 800 nm.

In a preferred embodiment, the organic electroluminescent device is a device selected from the group consisting of an organic light emitting diode (OLED), a light emitting electrochemical cell (LEC), and a light-emitting transistor.

Particularly preferably, the organic electroluminescent device is an organic light emitting diode (OLED). Optionally, the organic electroluminescent device as a whole may be intransparent, semi-transparent or (essentially) transparent.

The term "layer" as used in the context of the present invention preferably is a body that bears an extensively planar geometry.

The light-emitting layer B preferably bears a thickness of not more than 1 mm, more preferably not more than 0.1 mm, even more preferably not more than 10 µm, even more preferably not more than 1 µm, in particular not more than 0.1 µm.

In a preferred embodiment, the thermally activated delayed fluorescence (TADF) material $E^B$ is an organic TADF emitter. According to the invention, organic emitter or organic material means that the emitter or material (predominantly) consists of the elements hydrogen, carbon, nitrogen, and optionally fluorine and optionally oxygen. Particularly preferably, it does not contain any transition metals.

In a preferred embodiment, the TADF material $E^B$ is an organic TADF emitter. In a preferred embodiment, the depopulation agent $S^B$ is an organic TADF emitter. In a more preferred embodiment, the TADF material $E^B$ and the depopulation agent $S^B$ are both organic TADF emitters.

In a particularly preferred embodiment, the at least one TADF material $E^B$ is a blue TADF emitter, preferably a deep-blue TADF emitter.

The person skilled in the art will notice that the light-emitting layer B will typically be incorporated in the organic electroluminescent device of the present invention. Preferably, such organic electroluminescent device comprises at least the following layers: at least one light-emitting layer B, at least one anode layer A and at least one cathode layer C.

Preferably, the anode layer A contains at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof.

Preferably, the cathode layer C contains at least one component selected from the group consisting of Al, Au, Ag, Pt, Cu, Zn, Ni, Fe, Pb, In, W, Pd, LiF, Ca, Ba, Mg, and mixtures or alloys of two or more thereof.

Preferably, the light-emitting layer B is located between an anode layer A and a cathode layer C. Accordingly, the general set-up is preferably A-B-C. This does of course not exclude the presence of one or more optional further layers. These can be present at each side of A, of B and/or of C.

In a preferred embodiment, the organic electroluminescent device comprises at least the following layers:

A) an anode layer A containing at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof;

B) the light-emitting layer B; and

C) a cathode layer C containing at least one component selected from the group consisting of Al, Au, Ag, Pt, Cu, Zn, Ni, Fe, Pb, In, W, Pd, LiF, Ca, Ba, Mg, and mixtures or alloys of two or more thereof, wherein the light-emitting layer B is located between the anode layer A and the a cathode layer C.

In one embodiment, when the organic electroluminescent device is an OLED, it may optionally comprise the following layer structure:

A) an anode layer A, exemplarily comprising indium tin oxide (ITO);

HTL) a hole transport layer HTL;

B) a light-emitting layer B according to present invention as described herein;

ETL) an electron transport layer ETL; and

C) a cathode layer, exemplarily comprising Al, Ca and/or Mg.

Preferably, the order of the layers herein is A-HTL-B-ETL-C.

Furthermore, the organic electroluminescent device may optionally comprise one or more protective layers protecting the device from damaging exposure to harmful species in the environment including, exemplarily moisture, vapor and/or gases.

Preferably, the anode layer A is located on the surface of a substrate. The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C transparent. Preferably, the anode layer A comprises a large content or even consists of transparent conductive oxides (TCOs).

Such anode layer A may exemplarily comprise indium tin oxide, aluminum zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Particularly preferably, the anode layer A (essentially) consists of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may exemplarily comprise PEDOT:PSS (poly-3,4-ethylendioxy thiophene: polystyrene sulfonate), PEDOT (poly-3,4-ethylendioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)-benzi-dine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer B (serving as emitting layer (EML)). The hole transport layer (HTL) may also be an electron blocking layer (EBL). Preferably, hole transport compounds bear comparably high energy levels of their triplet states T1.

Exemplarily the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)-amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant.

Tetrafluorotetracyanoquinodimethane (F4-TCNQ), copper-pentafluorobenzoate (Cu(I)pFBz) or transition metal complexes may exemplarily be used as organic dopant.

The EBL may exemplarily comprise mCP (1,3-bis(carbazol-9-yl)benzene), TCTA, 2-TNATA, mCBP (3,3-di(9H-carbazol-9-yl)biphenyl), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, tris-Pcz, CzSi (9-(4-tert-butylphenyl)-3,6-bis(triphenylsilyl)-9H-carbazole), and/or DCB (N,N'-dicarbazolyl-1,4-dimethylbenzene).

According to the invention, the emission layer B comprises at least one host material $H^B$, the TADF material $E^B$ and the electron-trap material $S^B$.

In a preferred embodiment of the invention, the light-emitting layer B comprises 40-98%, more preferably 57-93%, even more preferably 74-87% by weight of the host compound $H^B$.

In a preferred embodiment of the invention, the light-emitting layer B comprises 1-50%, more preferably 5-35%, even more preferably 10-20% by weight of the TADF material $E^B$.

In a preferred embodiment of the invention, the light-emitting layer B comprises 1-10%, more preferably 2-8%, even more preferably 3-6% by weight of the depopulation agent $S^B$.

In a preferred embodiment of the invention, the light-emitting layer B comprises up to 93% by weight of one or more further host compounds $H^{B2}$ differing from $H^B$.

In a preferred embodiment of the invention, the light-emitting layer B comprises up to 93% by weight of one or more solvents, In a preferred embodiment of the invention, the light-emitting layer B comprises (or consists of):

(i) 40-98%, more preferably 57-93%, even more preferably 74-87% by weight of the host compound $H^B$;

(ii) 1-50%, more preferably 5-35%, even more preferably 10-20% by weight of the TADF material $E^B$; and (iii) 1-10%, more preferably 2-8%, even more preferably 3-6% by weight of the depopulation agent $S^B$; and optionally (iv) 0-93% by weight of one or more further host compounds $H^{B2}$ differing from $H^B$; and optionally (v) 0-93% by weight of one or more solvents.

Preferably, the contents of (i) to (v) sum up to 100% by weight.

Exemplarily, the host material $H^B$ and/or the optionally present further host compound $H^{B2}$ may be selected from the group consisting of CBP (4,4'-Bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl] ether oxide), 9-[3-(dibenzofuran-2-yl)phenyl]-9H-carbazole, 9-[3-(dibenzofuran-2-yl)phenyl]-9H-carbazole, 9-[3-(dibenzothio-phen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). In one embodiment of the invention, the emission layer B comprises a so-called mixed-host system with at least one hole-dominant (n-type) host and one electron-dominant (p-type) host.

In one embodiment, the emission layer B comprises the TADF material $E^B$ and the depopulation agent $S^B$, and hole-dominant host $H^B$ selected from the group consisting of CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole.

In a preferred embodiment, the TADF material $E^B$ has a highest occupied molecular orbital HOMO($E^B$) having an energy $E^{HOMO}(E^B)$ and the host compound $H^B$ has a highest occupied molecular orbital HOMO($H^B$) having an energy $E^{HOMO}(H^B)$, wherein $E^{HOMO}(E^B)-E^{HOMO}(H^B) \leq 0.3$ eV and $E^{HOMO}(E^B)-E^{HOMO}(H^B) \geq -0.3$ eV. In other words, the HOMO($H^B$) of the host $H^B$ can be higher or lower in energy compared to the HOMO($E^B$) of the TADF material $E^B$, but the difference does not exceed 0.3 eV, more preferably does not exceed 0.2 eV.

In a preferred embodiment, the depopulation agent $S^B$ has a highest occupied molecular orbital HOMO($S^B$) having an energy $E^{HOMO}(S^B)$ and the host compound $H^B$ has a highest occupied molecular orbital HOMO($H^B$) having an energy $E^{HOMO}(H^B)$, wherein $E^{HOMO}(S^B)-E^{HOMO}(H^B) \leq 0.3$ eV and $E^{HOMO}(S^B)-E^{HOMO}(H^B) \geq -0.3$ eV. In other word, the HOMO($H^B$) of the host $H^B$ can be higher or lower in energy compared to the HOMO($S^B$) of the depopulation agent $S^B$, but the difference does not exceed 0.4 eV, preferably 0.3 eV, more preferably does not exceed 0.2 eV.

In a further preferred embodiment, the TADF material $E^B$ has a highest occupied molecular orbital HOMO($E^B$) having an energy $E^{HOMO}(E^B)$, the depopulation agent $S^B$ has a highest occupied molecular orbital HOMO($S^B$) having an energy $E^{HOMO}(S^B)$ and the host compound $H^B$ has a highest occupied molecular orbital HOMO($H^B$) having an energy $E^{HOMO}(H^B)$, wherein $$E^{HOMO}(E^B) \geq E^{HOMO}(H^B) \geq E^{HOMO}(S^B).$$

In a further embodiment, the TADF material $E^B$ has a highest occupied molecular orbital HOMO($E^B$) having an energy $E^{HOMO}(E^B)$, the depopulation agent $S^B$ has a highest occupied molecular orbital HOMO($S^B$) having an energy $E^{HOMO}(S^B)$ and the host compound $H^B$ has a highest occupied molecular orbital HOMO($H^B$) having an energy $E^{HOMO}(H^B)$, wherein $E^{HOMO}(E^B) > E^{HOMO}(H^B) > E^{HOMO}(S^B)$. In this embodiment, the TADF material $E^B$ significantly participates in the hole-transport.

In a further embodiment, the TADF material $E^B$ has a highest occupied molecular orbital HOMO($E^B$) having an energy $E^{HOMO}(E^B)$, the depopulation agent $S^B$ has a highest occupied molecular orbital HOMO($S^B$) having an energy $E^{HOMO}(S^B)$ and the host compound $H^B$ has a highest occupied molecular orbital HOMO($H^B$) having an energy $E^{HOMO}(H^B)$, wherein $$E^{HOMO}(H^B) \geq E^{HOMO}(E^B) \geq E^{HOMO}(S^B).$$

In a further embodiment, the TADF material $E^B$ has a highest occupied molecular orbital HOMO($E^B$) having an energy $E^{HOMO}(E^B)$, the depopulation agent $S^B$ has a highest occupied molecular orbital HOMO($S^B$) having an energy $E^{HOMO}(S^B)$ and the host compound $H^B$ has a highest occupied molecular orbital HOMO($H^B$) having an energy $E^{HOMO}(H^B)$, wherein $E^{HOMO}(H^B) > E^{HOMO}(E^B) > E^{HOMO}(S^B)$. In this embodiment, the host significantly participates in the hole-transport.

In another embodiment, the TADF material $E^B$ has a lowest unoccupied molecular orbital LUMO($E^B$) having an energy $E^{LUMO}(E^B)$ and the host compound $H^B$ has a lowest unoccupied molecular orbital LUMO($H^B$) having an energy $E^{LUMO}(H^B)$, wherein $E^{LUMO}(E^B)-E^{LUMO}(H^B) \leq 0.4$ eV and $E^{LUMO}(E^B)-E^{LUMO}(H^B) \geq -0.4$ eV. In other word, the LUMO($H^B$) of the host $H^B$ can be higher or lower in energy compared to the LUMO($E^B$) of the TADF material $E^B$, but the difference does not exceed 0.4 eV, more preferably does not exceed 0.3 eV.

In a further embodiment, the TADF material $E^B$ has a lowest unoccupied molecular orbital LUMO($E^B$) having an energy $E^{LUMO}(E^B)$, the depopulation agent $S^B$ has a lowest unoccupied molecular orbital LUMO($S^B$) having an energy $E^{LUMO}(S^B)$ and the host compound $H^B$ has a lowest unoccupied molecular orbital LUMO($H^B$) having an energy $E^{LUMO}(H^B)$, wherein $E^{LUMO}(S^B) \leq E^{LUMO}(H^B) \leq E^{LUMO}(E^B)$.

In a preferred embodiment, the emission layer B comprises the TADF material $E^B$ having a highest occupied molecular orbital HOMO($E^B$) having an energy $E^{HOMO}(E^B)$ and a lowest unoccupied molecular orbital LUMO($E^B$) having an energy $E^{LUMO}(E^B)$, the depopulation agent $S^B$ having a highest occupied molecular orbital HOMO($S^B$) having an energy $E^{HOMO}(S^B)$ and a lowest unoccupied molecular orbital LUMO($S^B$) having an energy $E^{LUMO}(S^B)$ and the host compound $H^B$ having a highest occupied molecular orbital HOMO($H^B$) having an energy $E^{HOMO}(H^B)$ and a lowest unoccupied molecular orbital LUMO($H^B$) having an energy $E^{LUMO}(H^B)$, wherein $E^{LUMO}(S^B) \leq E^{LUMO}(E^B) \leq E^{LUMO}(H^B)$ and $E^{HOMO}(E^B) > E^{HOMO}(H^B) > E^{LUMO}(S^B)$.

In a further embodiment, the emission layer B comprises the TADF material $E^B$ having a highest occupied molecular orbital HOMO($E^B$) having an energy $E^{HOMO}(E^B)$ and a lowest unoccupied molecular orbital LUMO($E^B$) having an energy $E^{LUMO}(E^B)$, the depopulation agent $S^B$ having a highest occupied molecular orbital HOMO($S^B$) having an energy $E^{HOMO}(S^B)$ and a lowest unoccupied molecular orbital LUMO($S^B$) having an energy $E^{LUMO}(S^B)$, the host compound $H^B$ having a highest occupied molecular orbital HOMO($H^B$) having an energy $E^{HOMO}(H^B)$ and a lowest unoccupied molecular orbital LUMO($H^B$) having an energy $E^{LUMO}(H^B)$ and a further host compound $H^{B2}$ having a highest occupied molecular orbital HOMO($H^{B2}$) having an energy $E^{HOMO}(H^{B2})$ and a lowest unoccupied molecular orbital LUMO($H^{B2}$) having an energy $E^{LUMO}(H^{B2})$; wherein $$E^{HOMO}(E^B)-E^{HOMO}(H^B) \leq 0.3 \text{ eV and } E^{HOMO}(E^B)-E^{HOMO}(H^B) \geq -0.3 \text{ eV; and}$$

$$E^{LUMO}(E^B)-E^{LUMO}(H^{B2}) \leq 0.4 \text{ eV and } E^{LUMO}(E^B)-E^{LUMO}(H^{B2}) \geq -0.4 \text{ eV}.$$

In a preferred embodiment, the emission layer B comprises the TADF material $E^B$ and depopulation agent $S^B$, a mixed-host system comprising T2T as electron-dominant host $H^{B2}$ and a host $H^B$ selected from the group consisting of CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host.

The host material $H^B$ has a lowermost excited singlet state energy level $S1^H$ and a lowermost excited triplet state energy level $T1^H$.

The TADF material $E^B$ has a lowermost excited singlet state energy level $S1^E$ and a lowermost excited triplet state energy level $T1^E$.

The depopulation agent $S^B$ has a lowermost excited singlet state energy level $S1^S$ and a lowermost excited triplet state energy level $T1^S$.

In a preferred embodiment, the lowermost excited triplet state of the host material $H^B$ is higher in energy than the lowermost excited triplet state of the TADF material $E^B$: $T1^H > T1^E$.

In a preferred embodiment, the lowermost excited triplet state of the host material $H^B$ is higher in energy than the lowermost excited triplet state of the depopulation agent $S^B$: $T1^H > T1^S$.

In a preferred embodiment, the lowermost excited singlet state of the host material $H^B$ is higher in energy than the lowermost excited singlet state of the TADF material $E^B$: $S1^H > S1^E$.

In a preferred embodiment, the lowermost excited singlet state of the host material $H^B$ is higher in energy than the lowermost excited singlet state of the depopulation agent $S^B$: $S1^H > S1^S$.

Orbital and excited state energies can be determined either by means of experimental methods known to the person skilled in the art. Experimentally, the energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E^{HOMO} + E^{gap}$, where $E^{gap}$ is determined as follows: For host compounds, the onset of emission of a film with 10% by weight of host in poly(methyl methacrylate) (PMMA) is used as $E^{gap}$, unless stated otherwise. For emitter compounds, $E^{gap}$ is determined as the energy at which the excitation and emission spectra of a film with 10% by weight of emitter in PMMA cross.

For host compounds, the onset of emission of a film with 10% by weight of host in poly(methyl methacrylate) (PMMA), which corresponds to the energy of the first excited singlet state S1, is used as $E^{gap}$, unless stated otherwise. For emitter compounds, $E^{gap}$ and thus the energy of the first excited singlet state S1 is determined in the same way, unless stated otherwise. For host compounds, the energy of the first excited triplet state T1 is determined from the onset of the time-gated emission spectrum at 77 K, typically with a delay time of 1 ms and an integration time of 1 ms, if not otherwise stated measured in a film of poly(methyl methacrylate) (PMMA) with 10% by weight of host. For TADF emitter compounds, the energy of the first excited triplet state T1 is determined from the onset of the time-gated emission spectrum at 77 K, typically with a delay time of 1 ms and an integration time of 1 ms.

In the electron transport layer (ETL), any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter $ETM^D$ may also be a star-shaped heterocycle such as 1,3,5-tri(1-phenyl-1H-benzo[d]imidazol-2-yl)phenyl (TPBi). The $ETM^D$ may exemplarily be NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl) diphenylsilane), BmPyPhB (1,3-bis[3,5-di(pyridin-3-yl) phenyl]benzene) and/or BTB (4,4'-bis-[2-(4,6-diphenyl-1,3,5-triazinyl)]-1,1'-biphenyl). Optionally, the electron transport layer may be doped with materials such as Liq (8-hydroxyquinolinolatolithium). Optionally, a second electron transport layer may be located between electron transport layer and the cathode layer C.

Adjacent to the electron transport layer (ETL), a cathode layer C may be located. Exemplarily, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer C may also consist of (essentially) intransparent metals such as Mg, Ca or Al. Alternatively or additionally, the cathode layer C may also comprise graphite and or carbon nanotubes (CNTs). Alternatively, the cathode layer C may also consist of nanoscale silver wires.

An OLED may further, optionally, comprise a protection layer between the electron transport layer (ETL) D and the cathode layer C (which may be designated as electron injection layer (EIL)). This layer may comprise lithium fluoride, caesium fluoride, silver, Liq (8-hydroxyquinolinolatolithium), $Li_2O$, $BaF_2$, MgO and/or NaF.

As used herein, if not defined more specifically in a particular context, the designation of the colors of emitted and/or absorbed light is as follows:
violet: wavelength range of >380-420 nm;
deep blue: wavelength range of >420-470 nm;
sky blue: wavelength range of >470-500 nm;
green: wavelength range of >500-560 nm;
yellow: wavelength range of >560-580 nm;
orange: wavelength range of >580-620 nm;
red: wavelength range of >620-800 nm.

With respect to emitter compounds, such colors refer to the emission maximum $\lambda_{max}^{PMMA}$ of a poly(methyl methacrylate) (PMMA) film with 10% by weight of the emitter. Therefore, exemplarily, a deep blue emitter has an emission maximum $\lambda_{max}^{PMMA}$ in the range of from 420 to 470 nm, a sky blue emitter has an emission maximum $\lambda_{max}^{PMMA}$ in the range of from 470 to 500 nm, a green emitter has an emission maximum $\lambda_{max}^{PMMA}$ in a range of from 500 to 560 nm, a red emitter has an emission maximum $\lambda_{max}^{PMMA}$ in a range of from 620 to 800 nm.

A deep blue emitter may preferably have an emission maximum $\lambda_{max}^{PMMA}$ of below 475 nm, more preferably below 470 nm, even more preferably below 465 nm or even below 460 nm. It will typically be above 420 nm, preferably above 430 nm, more preferably above 440 nm.

In one aspect of the invention, the TADF material $E^B$ is a deep blue emitter.

Accordingly, a further embodiment of the present invention relates to an OLED, which exhibits an external quantum efficiency at 1000 cd/m² of more than 10%, more preferably of more than 12%, more preferably of more than 15%, even more preferably of more than 17% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/m² of more than 100 h, preferably more than 200 h, more preferably more than 400 h, even more preferably more than 750 h or even more than 1000 h.

A further embodiment of the present invention relates to an OLED, which emits light at a distinct color point. According to the present invention, the OLED emits light with a narrow emission band (small full width at half maximum (FWHM)). In a preferred embodiment, the OLED according to the invention emits light with a FWHM of the main emission peak of below 0.50 eV, more preferably of below 0.46 eV, even more preferably of below 0.43 eV or even below 0.41 eV.

A further aspect of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs. In commercial applications, typically top-emitting (top-electrode is transparent) devices are used, whereas test devices as used throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al. doi:10.1002/sdtp.10480). Accordingly, a further aspect of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

In a preferred embodiment, the TADF material $E^B$ exhibits an emission maximum $\lambda_{max}^{PMMA}(E^B)$ in the range of from 450 to 470 nm (i.e., 470 nm≥$\lambda_{max}^{PMMA}(E^B)$≥450 nm).

TADF Material $E^B$

In a preferred embodiment, the TADF material $E^B$ consists of a first chemical moiety comprising or consisting of a structure of Formula I:

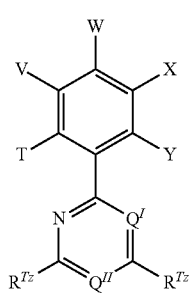

Formula I and one or two second chemical moieties comprising or consisting of a structure of Formula II:

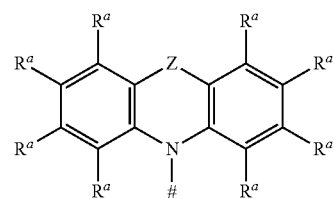

Formula II

The first chemical moiety is linked to each of the second chemical moiety via a single bond.

$Q^I$ is either N or CH.

$Q^{II}$ is either N or CH.

According to the invention, at least one of $Q^I$ and $Q^{II}$ is N.

In one embodiment, $Q^I$ is N and $Q^{II}$ is CH.

In one embodiment, $Q^{II}$ is N and $Q^I$ is CH.

In one embodiment, $Q^I$ and $Q^{II}$ is each N.

T is selected from the group consisting of the binding site of a single bond linking the first chemical moiety to the second chemical moiety, hydrogen (H), deuterium (D), and $R^1$.

V is selected from the group consisting of the binding site of a single bond linking the first chemical moiety to the second chemical moiety, H, D, and $R^1$.

W is selected from the group consisting of the binding site of a single bond linking the first chemical moiety to the second chemical moiety, H, D, and $R^1$.

X is selected from the group consisting of the binding site of a single bond linking the first chemical moiety to the second chemical moiety, H, D, and $R^1$.

Y is selected from the group consisting of the binding site of a single bond linking the first chemical moiety to the second chemical moiety, H, D, and $R^1$.

represents the binding site of a single bond linking the second chemical moieties to the first chemical moiety.

Z is at each occurrence independently from another selected from the group consisting of a direct bond, $CR^3R^4$, $C=CR^3R^4$, $C=O$, $C=NR^3$, $NR^3$, O, $SiR^3R^4$, S, S(O) and $S(O)_2$.

$R^1$ is selected from the group consisting of

CN, $CF_3$, $SiPh_3$, $GePh_3$, and a third chemical moiety comprising or consisting of a structure of Formula Q:

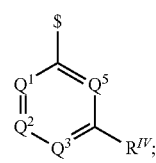

Formula Q $Q^1$ is selected from the group consisting of N and C-$R^I$.

$Q^2$ is selected from the group consisting of N and C-$R^{II}$.

$Q^3$ is selected from the group consisting of N and C-$R^{III}$.

$Q^5$ is selected from the group consisting of N and C-$R^V$.

$ represents the binding site of a single bond linking the third chemical moiety to the first chemical moiety.

$R^I$ is selected from the group consisting of H, D, CN, $CF_3$, $SiPh_3$, $GePh_3$, F,
- phenyl, which is optionally substituted with one or more substituents $R^6$;
- triazinyl, which is optionally substituted with one or more substituents $R^6$;
- pyridyl, which is optionally substituted with one or more substituents $R^6$;
- pyrimidyl, which is optionally substituted with one or more substituents $R^6$; and
- a fourth chemical moiety comprising or consisting of a structure of Formula IIQ:

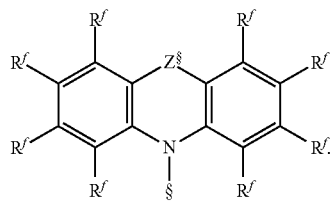

Formula IIQ

§ represents the binding site of a single bond linking the fourth chemical moiety to the third chemical moiety.

$Z^§$ is at each occurrence independently from another selected from the group consisting of a direct bond, $CR^3R^4$, $C=CR^3R^4$, C=O, $C=NR^3$, $NR^3$, O, $SiR^3R^4$, S, S(O) and $S(O)_2$.

$R^{II}$ is at each occurrence independently from another selected from the group consisting of H, D, CN, $CF_3$, $SiPh_3$, $GePh_3$, F,
- phenyl, which is optionally substituted with one or more substituents $R^6$;
- triazinyl, which is optionally substituted with one or more substituents $R^6$;
- pyridyl, which is optionally substituted with one or more substituents $R^6$;
- pyrimidyl, which is optionally substituted with one or more substituents $R^6$; and
- a fourth chemical moiety comprising or consisting of a structure of Formula IIQ.

$R^{II}$ is at each occurrence independently from another selected from the group consisting of H, D, CN, $CF_3$, $SiPh_3$, $GePh_3$, F,
- triazinyl, which is optionally substituted with one or more substituents $R^6$;
- pyridyl, which is optionally substituted with one or more substituents $R^6$;
- pyrimidyl, which is optionally substituted with one or more substituents $R^6$; and
- a fourth chemical moiety comprising or consisting of a structure of Formula IIQ.

$R^{IV}$ is at each occurrence independently from another selected from the group consisting of H, D, CN, $CF_3$, $SiPh_3$, $GePh_3$, F,
- phenyl, which is optionally substituted with one or more substituents $R^6$;
- triazinyl, which is optionally substituted with one or more substituents $R^6$;
- pyridyl, which is optionally substituted with one or more substituents $R^6$;
- pyrimidyl, which is optionally substituted with one or more substituents $R^6$.

$R^V$ is at each occurrence independently from another selected from the group consisting of H, D, CN, $CF_3$, $SiPh_3$, $GePh_3$, F,
- triazinyl, which is optionally substituted with one or more substituents $R^6$;
- pyridyl, which is optionally substituted with one or more substituents $R^6$;
- pyrimidyl, which is optionally substituted with one or more substituents $R^6$.

$R^a$, $R^3$ and $R^4$ is at each occurrence independently from another selected from the group consisting of hydrogen, deuterium, $N(R^5)_2$, $OR^5$, $Si(R^5)_3$, $B(OR^5)_2$, $OSO_2R^5$, $CF_3$, CN, F, Br, I, $C_1$-$C_{40}$-alkyl,
- which is optionally substituted with one or more substituents $R^5$ and
- wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, P(=O)($R^5$), SO, $SO_2$, $NR^5$, O, S or $CONR^5$;

$C_1$-$C_{40}$-alkoxy,
- which is optionally substituted with one or more substituents $R^5$ and
- wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, P(=O)($R^5$), SO, $SO_2$, $NR^5$, O, S or $CONR^5$;

$C_1$-$C_{40}$-thioalkoxy,
- which is optionally substituted with one or more substituents $R^5$ and
- wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, P(=O)($R^5$), SO, $SO_2$, $NR^5$, O, S or $CONR^5$;

$C_2$-$C_{40}$-alkenyl,
- which is optionally substituted with one or more substituents $R^5$ and
- wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, P(=O)($R^5$), SO, $SO_2$, $NR^5$, O, S or $CONR^5$;

$C_2$-$C_{40}$-alkynyl,
- which is optionally substituted with one or more substituents $R^5$ and
- wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, P(=O)($R^5$), SO, $SO_2$, $NR^5$, O, S or $CONR^5$;

$C_6$-$C_{60}$-aryl,
- which is optionally substituted with one or more substituents $R^5$; and $C_3$-$C_{57}$-heteroaryl,
- which is optionally substituted with one or more substituents $R^5$.

$R^5$ is at each occurrence independently from another selected from the group consisting of hydrogen, deuterium, $N(R^6)_2$, $OR^6$, $Si(R^6)_3$, $B(OR^6)_2$, $OSO_2R^6$, $CF_3$, CN, F, Br, I, $C_1$-$C_{40}$-alkyl,
- which is optionally substituted with one or more substituents $R^6$ and
- wherein one or more non-adjacent $CH_2$-groups are optionally substituted by $R^6C=CR^6$, C≡C, $Si(R^6)_2$, $Ge(R^6)_2$, $Sn(R^6)_2$, C=O, C=S, C=Se, $C=NR^6$, P(=O)($R^6$), SO, $SO_2$, $NR^6$, O, S or $CONR^6$;

$C_1$-$C_{40}$-alkoxy,
- which is optionally substituted with one or more substituents $R^6$ and wherein one or more non-adjacent CH$_2$-groups are optionally substituted by R$^6$C=CR$^6$, C≡C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$;

C$_1$-C$_{40}$-thioalkoxy,
which is optionally substituted with one or more substituents R$^6$ and
wherein one or more non-adjacent CH$_2$-groups are optionally substituted by R$^6$C=CR$^6$, C≡C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$;

C$_2$-C$_{40}$-alkenyl,
which is optionally substituted with one or more substituents R$^6$ and
wherein one or more non-adjacent CH$_2$-groups are optionally substituted by R$^6$C=CR$^6$, C≡C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$;

C$_2$-C$_{40}$-alkynyl,
which is optionally substituted with one or more substituents R$^6$ and
wherein one or more non-adjacent CH$_2$-groups are optionally substituted by R$^6$C=CR$^6$, C≡C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$;

C$_6$-C$_{60}$-aryl,
which is optionally substituted with one or more substituents R$^6$; and C$_3$-C$_{57}$-heteroaryl,
which is optionally substituted with one or more substituents R$^6$.

R$^f$ is at each occurrence independently from another selected from the group consisting of hydrogen, deuterium, N(R$^{5f}$)$_2$, OR$^{5f}$, Si(R$^{5f}$)$_3$, B(OR$^{5f}$)$_2$, OSO$_2$R$^{5f}$, CF$_3$, CN, F, Br, I, C$_1$-C$_{40}$-alkyl,
which is optionally substituted with one or more substituents R$^{5f}$ and
wherein one or more non-adjacent CH$_2$-groups are optionally substituted by R$^{5f}$C=CR$^{5f}$, C≡C, Si(R$^{5f}$)$_2$, Ge(R$^{5f}$)$_2$, Sn(R$^{5f}$)$_2$, C=O, C=S, C=Se, C=NR$^{5f}$, P(=O)(R$^{5f}$), SO, SO$_2$, NR$^{5f}$, O, S or CONR$^{5f}$;

C$_1$-C$_{40}$-alkoxy,
which is optionally substituted with one or more substituents R$^{5f}$ and
wherein one or more non-adjacent CH$_2$-groups are optionally substituted by R$^{5f}$C=CR$^{5f}$, C≡C, Si(R$^{5f}$)$_2$, Ge(R$^{5f}$)$_2$, Sn(R$^{5f}$)$_2$, C=O, C=S, C=Se, C=NR$^{5f}$, P(=O)(R$^{5f}$), SO, SO$_2$, NR$^{5f}$, O, S or CONR$^{5f}$;

C$_1$-C$_{40}$-thioalkoxy,
which is optionally substituted with one or more substituents R$^{5f}$ and
wherein one or more non-adjacent CH$_2$-groups are optionally substituted by R$^{5f}$C=CR$^{5f}$, C=C, Si(R$^{5f}$)$_2$, Ge(R$^{5f}$)$_2$, Sn(R$^{5f}$)$_2$, C=O, C=S, C=Se, C=NR$^{5f}$, P(=O)(R$^{5f}$), SO, SO$_2$, NR$^{5f}$, O, S or CONR$^{5f}$;

C$_2$-C$_{40}$-alkenyl,
which is optionally substituted with one or more substituents R$^{5f}$ and
wherein one or more non-adjacent CH$_2$-groups are optionally substituted by R$^{5f}$C=CR$^{5f}$, C=C, Si(R$^{5f}$)$_2$, Ge(R$^{5f}$)$_2$, Sn(R$^{5f}$)$_2$, C=O, C=S, C=Se, C=NR$^{5f}$, P(=O)(R$^{5f}$), SO, SO$_2$, NR$^{5f}$, O, S or CONR$^{5f}$;

C$_2$-C$_{40}$-alkynyl,
which is optionally substituted with one or more substituents R$^{5f}$ and
wherein one or more non-adjacent CH$_2$-groups are optionally substituted by R$^{5f}$C=CR$^{5f}$, C=C, Si(R$^{5f}$)$_2$, Ge(R$^{5f}$)$_2$, Sn(R$^{5f}$)$_2$, C=O, C=S, C=Se, C=NR$^{5f}$, P(=O)(R 5 f), SO, SO$_2$, NW, O, S or CONR$^{5f}$;

C$_6$-C$_{60}$-aryl,
which is optionally substituted with one or more substituents R$^{5f}$; and C$_3$-C$_{57}$-heteroaryl,
which is optionally substituted with one or more substituents R$^{5f}$.

R$^{5f}$ is at each occurrence independently from another selected from the group consisting of hydrogen, deuterium, N(R$^6$)$_2$, OR$^6$, Si(R$^6$)$_3$, B(OR$^6$)$_2$, OSO$_2$R$^6$, CF$_3$, CN, F, Br, I, C$_1$-C$_{40}$-alkyl,
which is optionally substituted with one or more substituents R$^6$ and
wherein one or more non-adjacent CH$_2$-groups are optionally substituted by R$^6$C=CR$^6$, C=C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$;

C$_1$-C$_{40}$-alkoxy,
which is optionally substituted with one or more substituents R$^6$ and
wherein one or more non-adjacent CH$_2$-groups are optionally substituted by R$^6$C=CR$^6$, C≡C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$;

C$_1$-C$_{40}$-thioalkoxy,
which is optionally substituted with one or more substituents R$^6$ and
wherein one or more non-adjacent CH$_2$-groups are optionally substituted by R$^6$C=CR$^6$, C≡C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$;

C$_2$-C$_{40}$-alkenyl,
which is optionally substituted with one or more substituents R$^6$ and
wherein one or more non-adjacent CH$_2$-groups are optionally substituted by R$^6$C=CR$^6$, C≡C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$;

C$_2$-C$_{40}$-alkynyl,
which is optionally substituted with one or more substituents R$^6$ and
wherein one or more non-adjacent CH$_2$-groups are optionally substituted by R$^6$C=CR$^6$, C≡C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$;

C$_6$-C$_{60}$-aryl,
which is optionally substituted with one or more substituents R$^6$; and C$_3$-C$_{57}$-heteroaryl,
which is optionally substituted with one or more substituents R$^6$.

R$^6$ is at each occurrence independently from another selected from the group consisting of hydrogen, deuterium, OPh, CF$_3$, CN, F, C$_1$-C$_5$-alkyl,
wherein optionally one or more hydrogen atoms are independently from each other substituted by deuterium, CN, CF$_3$, or F;

C$_1$-C$_5$-alkoxy,
wherein optionally one or more hydrogen atoms are independently from each other substituted by deuterium, CN, CF$_3$, or F;

$C_1$-$C_5$-thioalkoxy,
wherein optionally one or more hydrogen atoms are independently from each other substituted by deuterium, CN, $CF_3$, or F;

$C_2$-$C_5$-alkenyl,
wherein optionally one or more hydrogen atoms are independently from each other substituted by deuterium, CN, $CF_3$, or F;

$C_2$-$C_5$-alkynyl,
wherein optionally one or more hydrogen atoms are independently from each other substituted by deuterium, CN, $CF_3$, or F;

$C_6$-$C_{18}$-aryl,
which is optionally substituted with one or more $C_1$-$C_5$-alkyl substituents;

$C_3$-$C_{17}$-heteroaryl,
which is optionally substituted with one or more $C_1$-$C_5$-alkyl substituents;

$N(C_8$-$C_{18}$-ary$)_2$;
$N(C_3$-$C_{17}$-heteroaryl$)_2$; and
$N(C_3$-$C_{17}$-heteroaryl)($C_8$-$C_{18}$-aryl).

$R^{Tz}$ is at each occurrence independently from another selected from the group consisting of CN, $CF_3$, SiPh3, F, phenyl, which is optionally substituted with one or more substituents $R^6$;

triazinyl, which is optionally substituted with one or more substituents $R^6$;

pyridyl, which is optionally substituted with one or more substituents $R^6$;

pyrimidyl, which is optionally substituted with one or more substituents $R^6$.

According to the invention, the substituents $R^a$, $R^3$, $R^4$ or $R^5$ independently from each other optionally form a mono- or polycyclic, (hetero)aliphatic, (hetero)aromatic and/or benzo-fused ring system with one or more substituents $R^a$, $R^3$, $R^4$ or $R^5$.

According to the invention, $R^f$ or $R^{5f}$ independently from each other optionally form a mono- or polycyclic, (hetero)aliphatic, (hetero)aromatic and/or benzo-fused ring system with one or more substituents $R^f$ or $R^{5f}$.

According to the invention, one or two substituents selected from the group consisting of T, V, W, X, and Y represent the binding site of a single bond linking the first chemical moiety and the second chemical moiety.

According to the invention, exactly one substituent selected from the group consisting of T, V, W, X, and Y is $R^1$.

In a preferred embodiment, the TADF material $E^B$ consists of a structure according to Formula Ia:

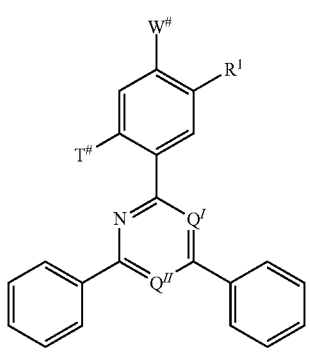

Formula Ia wherein
for $R^1$, $Q^I$ and $Q^{II}$ the aforementioned definitions apply.

$T^\#$ is selected from the group consisting of the binding site of a single bond linking the first chemical moiety to the second chemical moiety, H, D, and $R^1$.

$W^\#$ is selected from the group consisting of the binding site of a single bond linking the first chemical moiety to the second chemical moiety, H, D, and $R^1$.

According to the invention, exactly one substituent selected from the group consisting of $T^\#$ and $W^\#$ represents the binding site of a single bond linking the first chemical moiety and the second chemical moiety.

In one embodiment, T represents the binding site of a single bond linking the first chemical moiety and to the second chemical moiety.

In one embodiment, W represents the binding site of a single bond linking the first chemical moiety and to the second chemical moiety.

In one embodiment, the fourth chemical moiety comprising or consisting of a structure of Formula IIQ is identical to the one or two second chemical moieties comprising or consisting of a structure of Formula II.

In one embodiment, the fourth chemical moiety comprising or consisting of a structure of Formula IIQ is different to the one or two second chemical moieties comprising or consisting of a structure of Formula II.

In a preferred embodiment, Z is a direct bond at each occurrence.

In a preferred embodiment, the TADF material $E^B$ consists of a structure according to Formula III:

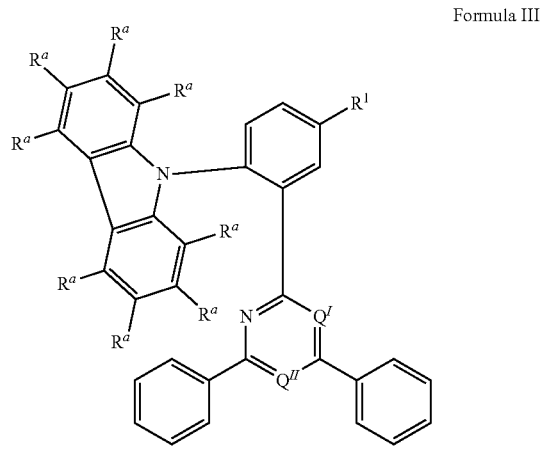

Formula III wherein
wherein $R^1$ is selected from the group consisting of structures according to Formulas A1 to A27:

Formula A1

-continued
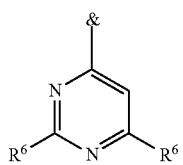
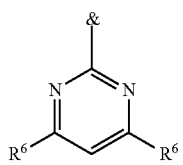
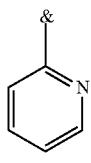
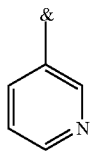
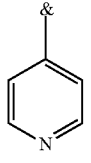
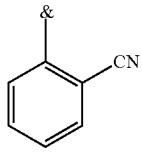
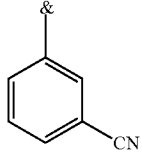
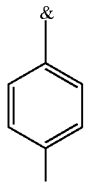
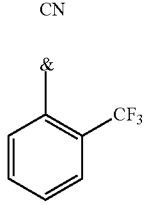
-continued
Formula A2
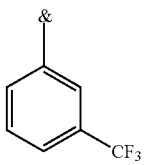
Formula A3
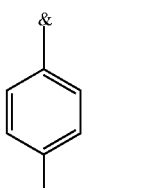
Formula A4
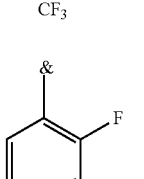
Formula A5
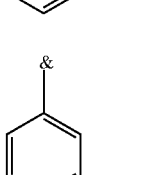
Formula F6
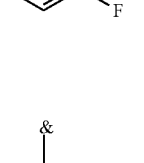
Formula A7
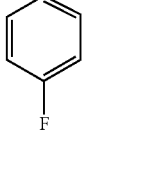
Formula A8
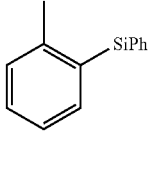
Formula A9
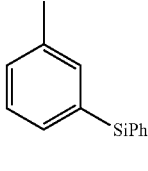
Formula A10
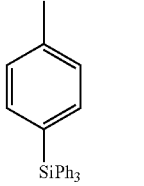
Formula A11
Formula A12
Formula A13
Formula A14
Formula A15
Formula A16
Formula A17
Formula A18

Formula A19

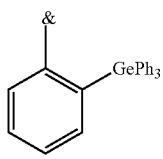

Formula A20

Formula A21

Formula A22

Formula A23

Formula A24

Formula A25

Formula A26

Formula A27

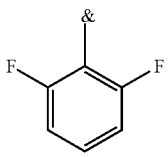

wherein & represents the binding site of a single bond linking $R^1$ to the first chemical moiety.

In one embodiment, the TADF material $E^B$ consists of a structure according to Formula IV:

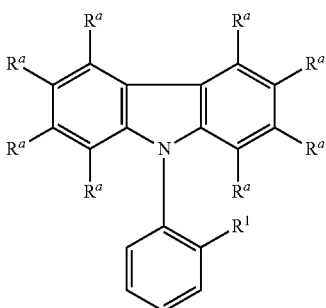

Formula IV wherein $R^1$ is selected is selected from the group consisting of structures according to Formulas A1 to A27:

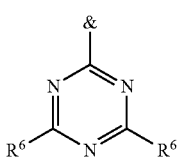

Formula A1

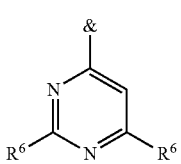

Formula A2

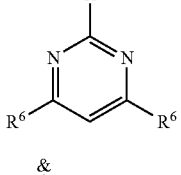

Formula A3

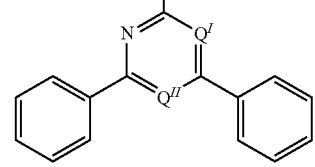

Formula A4

-continued
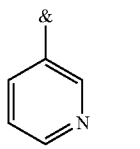
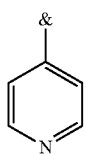
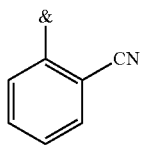
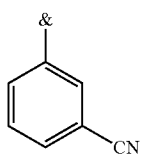
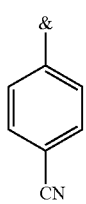
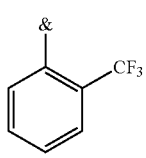
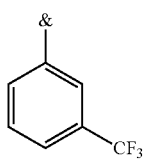
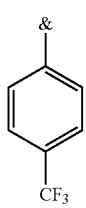
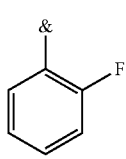
-continued
Formula A5
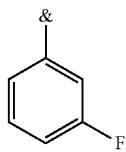
Formula A6
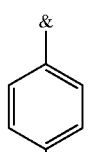
Formula A7
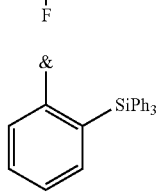
Formula A8
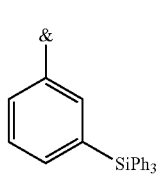
Formula A9
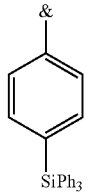
Formula A10
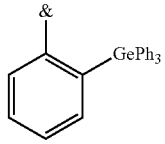
Formula A11
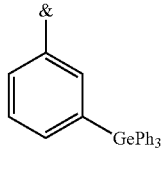
Formula A12
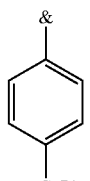
Formula A13
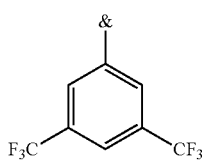
Formula A14
Formula A15
Formula A16
Formula A17
Formula A18
Formula A19
Formula A20
Formula A21
Formula A22

Formula A23
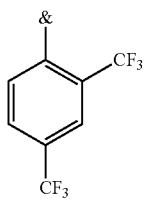

Formula A24
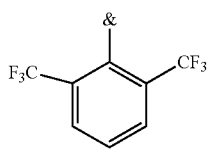

Formula A25
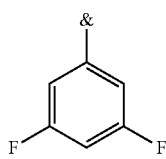

Formula A26
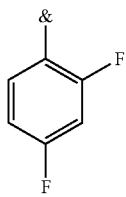

Formula A27
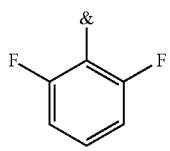

wherein & represents the binding site of a single bond linking $R^1$ to the first chemical moiety.

In one embodiment, the TADF material $E^B$ consists of a structure according to Formula V:

Formula V
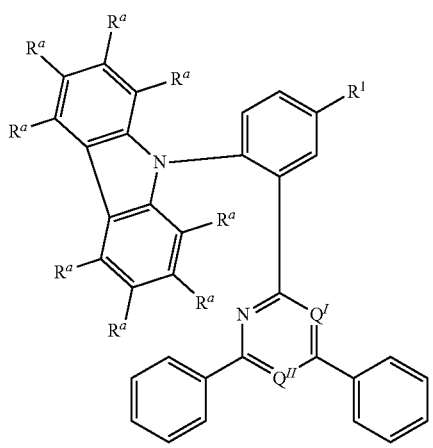

wherein $R^1$ is selected form the group consisting of structures according to Formulas B1 to B9:

Formula B1
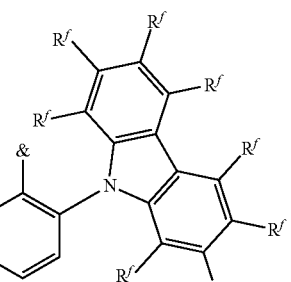

Formula B2
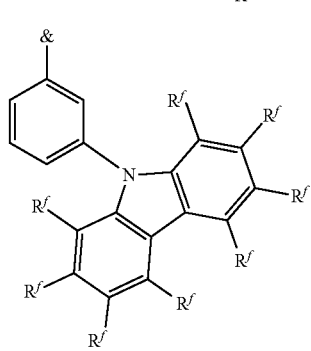

Formula B3
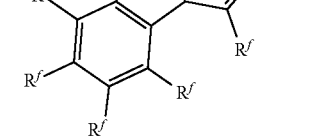

Formula B4
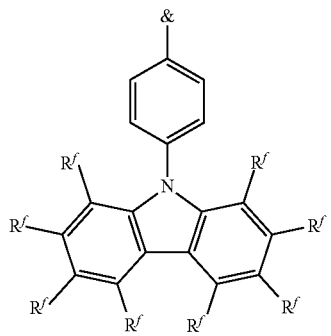

Formula B5
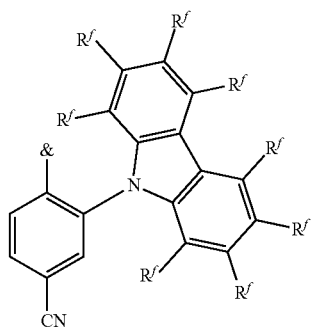

-continued

Formula B6

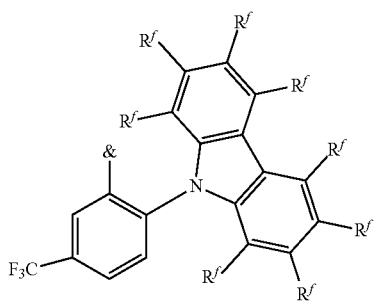

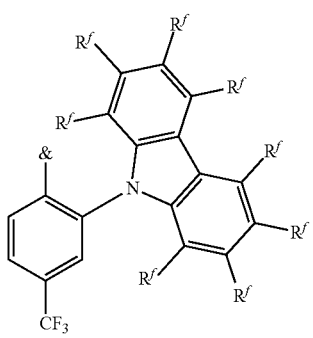

Formula B7

Formula B8

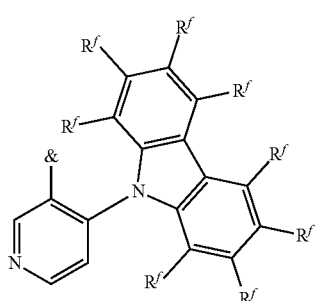

Formula B9

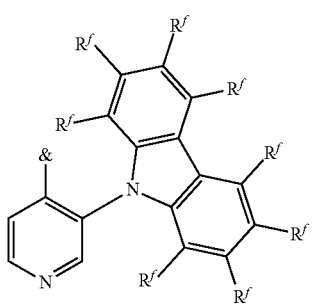

wherein & represents the binding site of a single bond linking $R^1$ to the first chemical moiety.

In one embodiment, the TADF material $E^B$ consists of a structure according to Formula VI:

Formula VI

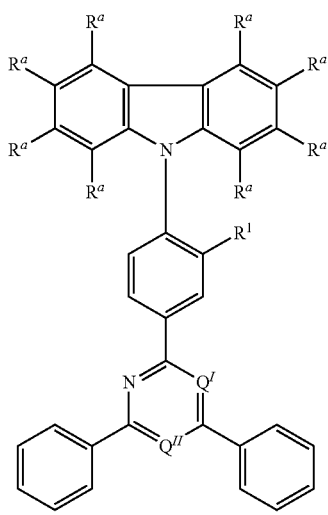

wherein $R^1$ is selected form the group consisting of structures according to Formulas B1 to B9:

Formula B1

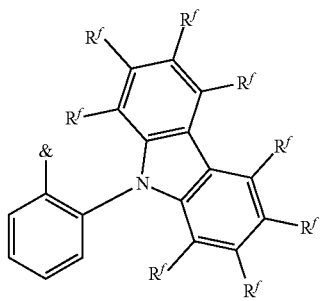

Formula B2

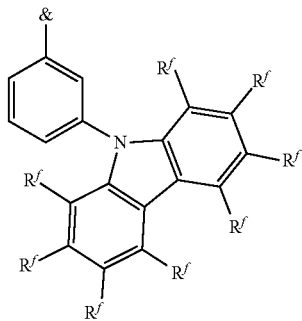

Formula B3

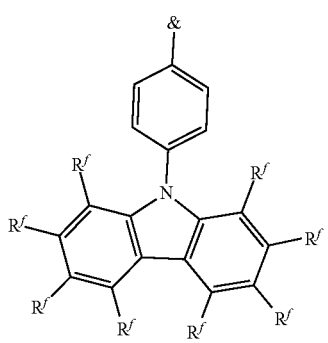

Formula B4

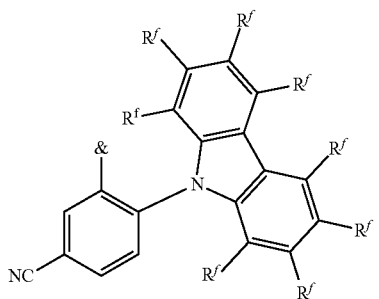

Formula B5

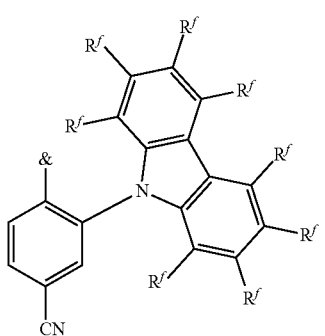

Formula B6

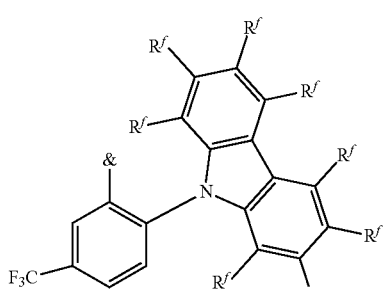

Formula B7

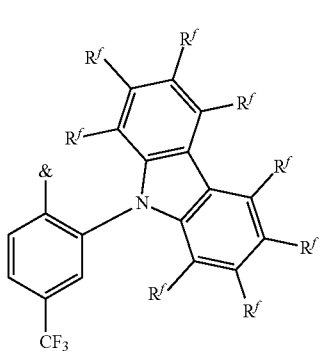

Formula B8

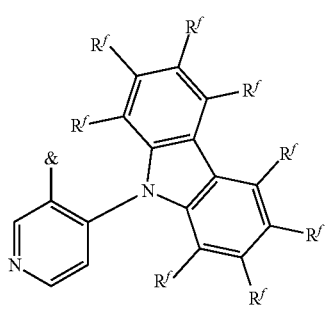

Formula B9

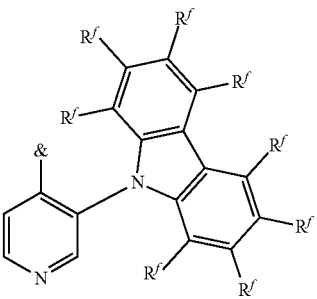

wherein & represents the binding site of a single bond linking $R^1$ to the first chemical moiety.

In one embodiment, the TADF material $E^B$ consists of a structure according to Formula VII:

Formula VII

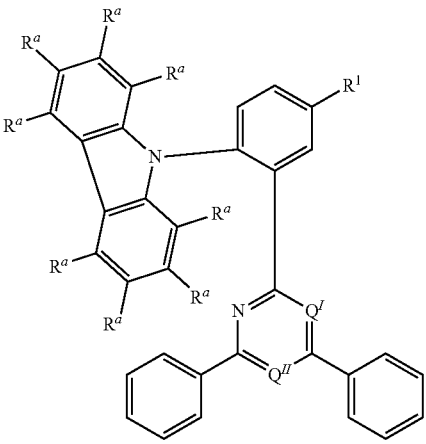

wherein $R^1$ is selected form the group consisting of structures according to Formulas D1 to D9:

Formula D1

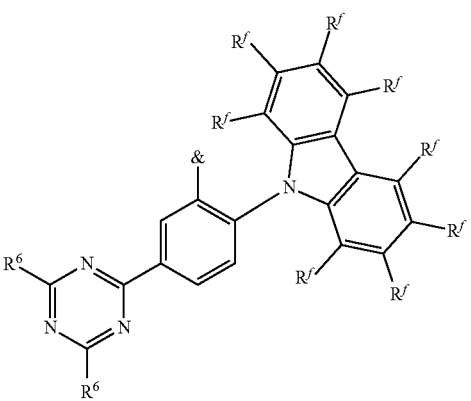

Formula D2
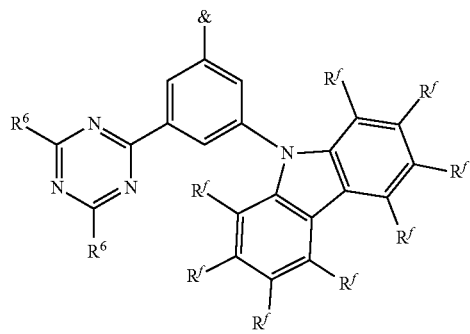
Formula D3
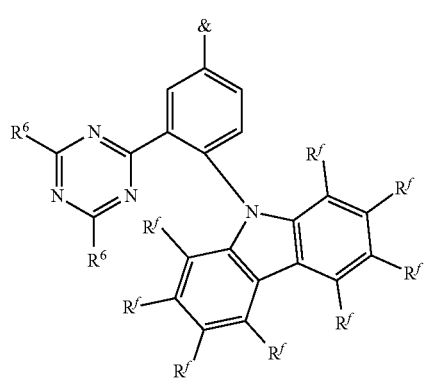
Formula D4
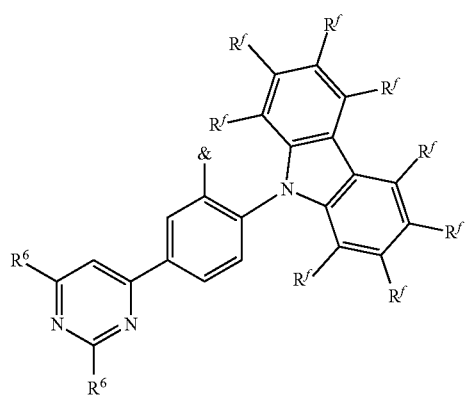
Formula D5
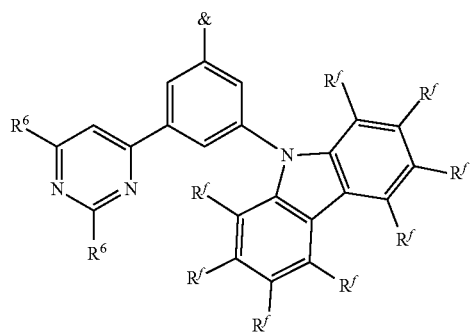
Formula D6
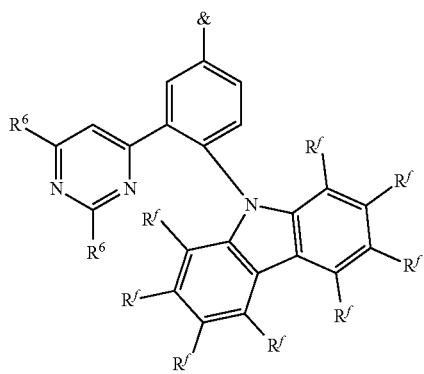
Formula D7
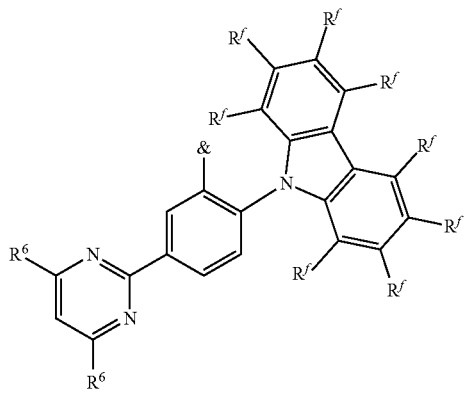
Formula D8
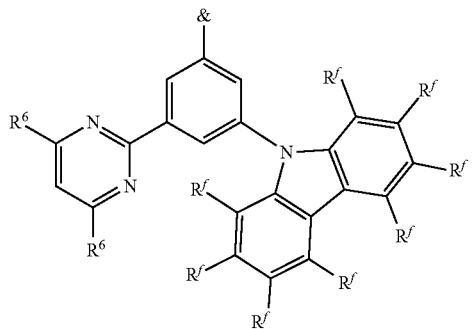
Formula D9
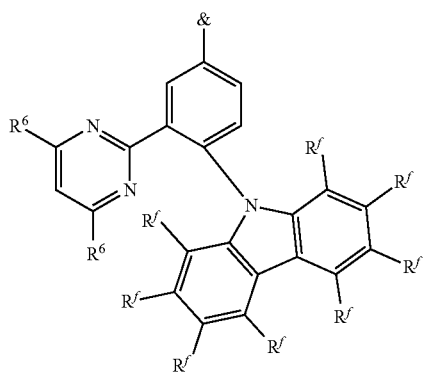
wherein & represents the binding site of a single bond linking $R^1$ to the first chemical moiety.

In one embodiment, the TADF material $E^B$ consists of a structure according to Formula VIII:
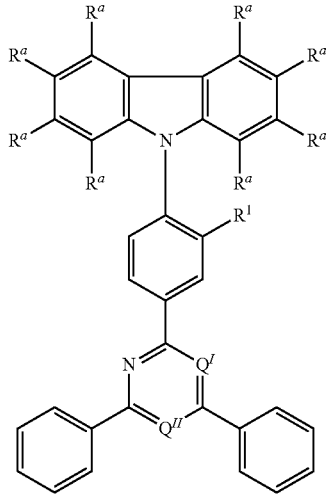
Formula VIII
wherein $R^1$ is selected form the group consisting of structures according to Formulas D1 to D9:
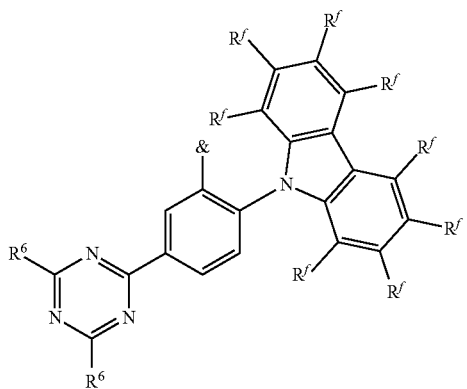
Formula D1
-continued
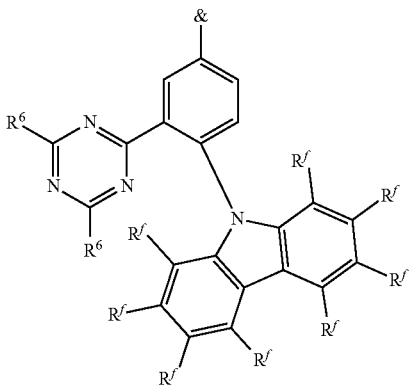
Formula D3
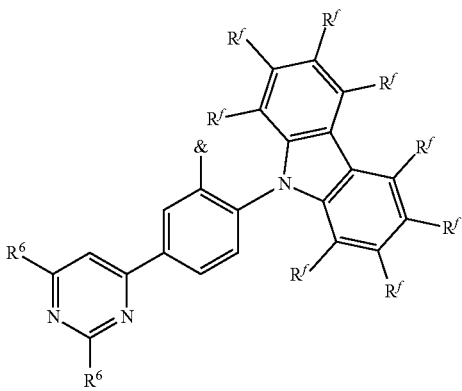
Formula D4
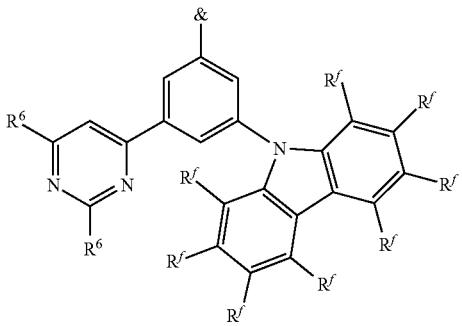
Formula D5
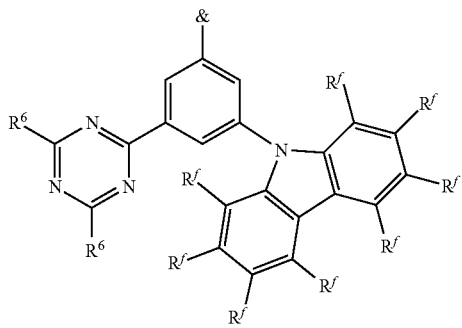
Formula D2
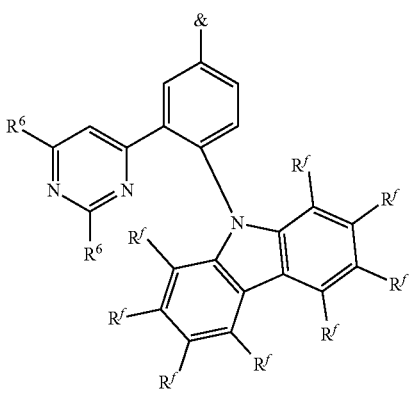
Formula D6

-continued

Formula D7

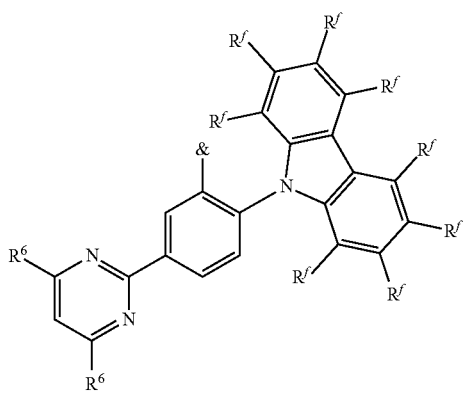

Formula D8

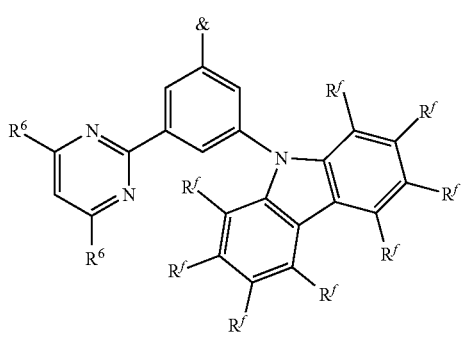

Formula D9

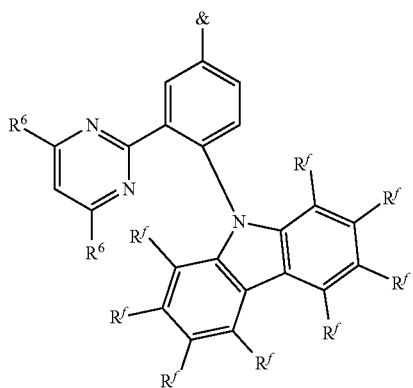

wherein & represents the binding site of a single bond linking $R^1$ to the first chemical moiety.

In a further embodiment of the invention, the one or two second chemical moieties comprise or consist of a structure of Formula IIa:

Formula IIa

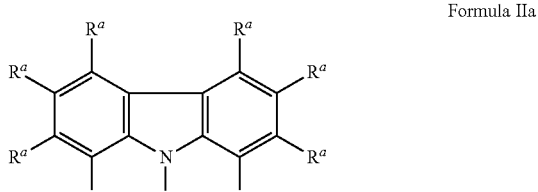

wherein # and $R^a$ are defined as described above.

In a further embodiment of the invention, $R^a$ is at each occurrence independently from another selected from the group consisting of
hydrogen,
Me, $^i$Pr, $^t$Bu, CN, CF$_3$,
Ph, which is optionally substituted with one or more substituents independently from each other selected from the group consisting of Me, $^i$Pr, $^t$Bu, CN, CF$_3$, and Ph,
pyridinyl, which is optionally substituted with one or more substituents independently from each other selected from the group consisting of Me, $^i$Pr, $^t$Bu, CN, CF$_3$, and Ph,
pyrimidinyl, which is optionally substituted with one or more substituents independently from each other selected from the group consisting of Me, $^i$Pr, $^t$Bu, CN, CF$_3$, and Ph,
carbazolyl, which is optionally substituted with one or more substituents independently from each other selected from the group consisting of Me, $^i$Pr, $^t$Bu, CN, CF$_3$, and Ph,
triazinyl, which is optionally substituted with one or more substituents independently from each other selected from the group consisting of Me, $^i$Pr, $^t$Bu, CN, CF$_3$, and Ph, and N(Ph)$_2$.

In a further embodiment of the invention, $R^a$ is at each occurrence independently from another selected from the group consisting of
hydrogen, Me, $^i$Pr, $^t$Bu, CN, CF$_3$,
Ph, which is optionally substituted with one or more substituents independently from each other selected from the group consisting of Me, $^i$Pr, $^t$Bu, CN, CF$_3$, and Ph,
pyridinyl, which is optionally substituted with one or more substituents independently from each other selected from the group consisting of Me, $^i$Pr, $^t$Bu, CN, CF$_3$, and Ph,
pyrimidinyl, which is optionally substituted with one or more substituents independently from each other selected from the group consisting of Me, $^i$Pr, $^t$Bu, CN, CF$_3$, and Ph, and
triazinyl, which is optionally substituted with one or more substituents independently from each other selected from the group consisting of Me, $^i$Pr, $^t$Bu, CN, CF$_3$, and Ph.

In a further embodiment of the invention, the one or two second chemical moieties comprise or consist of a structure of Formula IIb, a structure of Formula IIb-2, a structure of Formula IIb-3 or a structure of Formula IIb-4:

Formula IIb

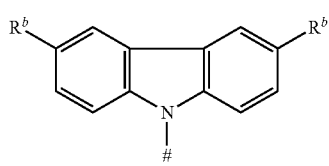

Formula IIb-2

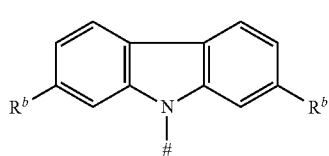

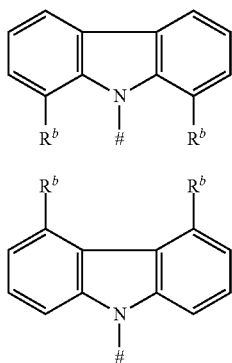

Formula IIb-3

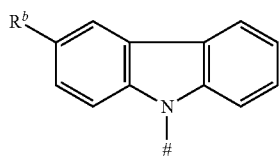

Formula IIc

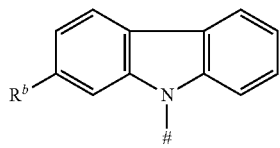

Formula IIc-2

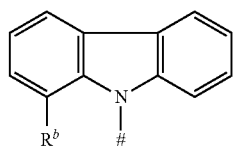

Formula IIc-3

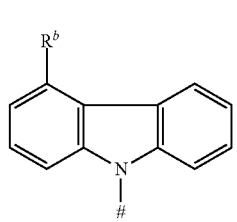

Formula IIc-4

Formula IIb-4

$R^b$ is at each occurrence independently from another selected from the group consisting of $N(R^5)_2$, $OR^5$, $Si(R^5)_3$, $B(OR^5)_2$, $OSO_2R^5$, $CF_3$, CN, F, Br, I, $C_1$-$C_{40}$-alkyl,
which is optionally substituted with one or more substituents $R^5$ and
wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;
$C_1$-$C_{40}$-alkoxy,
which is optionally substituted with one or more substituents $R^5$ and
wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;
$C_1$-$C_{40}$-thioalkoxy,
which is optionally substituted with one or more substituents $R^5$ and
wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;
$C_2$-$C_{40}$-alkenyl,
which is optionally substituted with one or more substituents $R^5$ and
wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;
$C_2$-$C_{40}$-alkynyl,
which is optionally substituted with one or more substituents $R^5$ and
wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;
$C_6$-$C_{60}$-aryl,
which is optionally substituted with one or more substituents $R^5$; and
$C_3$-$C_{57}$-heteroaryl,
which is optionally substituted with one or more substituents $R^5$.
For additional variables, the aforementioned definitions apply.

In one additional embodiment of the invention, the one or two second chemical moieties comprise or consist of a structure of Formula IIc, a structure of Formula IIc-2, a structure of Formula IIc-3 or a structure of Formula IIc-4:

wherein the aforementioned definitions apply.

In a further embodiment of the invention, $R^b$ is at each occurrence independently from another selected from the group consisting of
Me, $^i$Pr, $^t$Bu, CN, $CF_3$,
Ph, which is optionally substituted with one or more substituents independently from each other selected from the group consisting of Me, $^i$Pr, $^t$Bu, CN, $CF_3$, and Ph,
pyridinyl, which is optionally substituted with one or more substituents independently from each other selected from the group consisting of Me, $^i$Pr, $^t$Bu, CN, $CF_3$, and Ph,
pyrimidinyl, which is optionally substituted with one or more substituents independently from each other selected from the group consisting of Me, $^i$Pr, $^t$Bu, CN, $CF_3$, and Ph,
carbazolyl, which is optionally substituted with one or more substituents independently from each other selected from the group consisting of Me, $^i$Pr, $^t$Bu, CN, $CF_3$, and Ph,
triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, $R^b$ is at each occurrence independently from another selected from the group consisting of
Me, $^i$Pr, $^t$Bu, CN, $CF_3$,
Ph, which is optionally substituted with one or more substituents independently from each other selected from the group consisting of Me, $^i$Pr, $^t$Bu, CN, $CF_3$, and Ph,
pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, CF$_3$, and Ph, and triazinyl, which is optionally substituted with one or more substituents independently from each other selected from the group consisting of Me, $^i$Pr, $^t$Bu, CN, CF$_3$, and Ph.

In the following, examples of the second chemical moiety are shown:

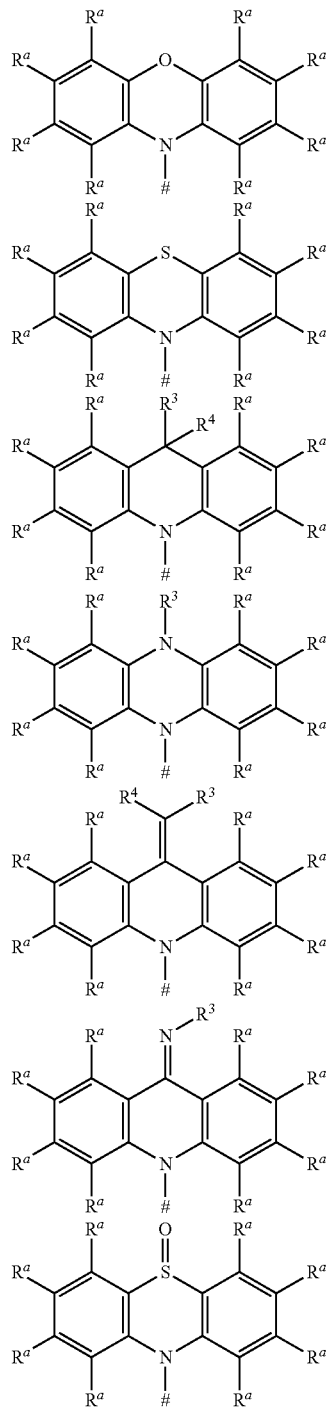

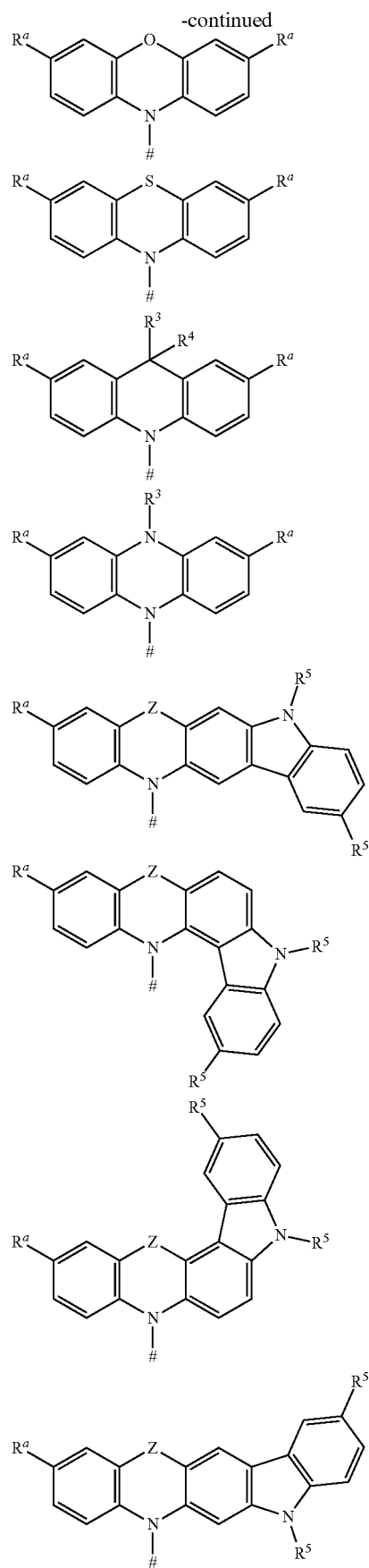

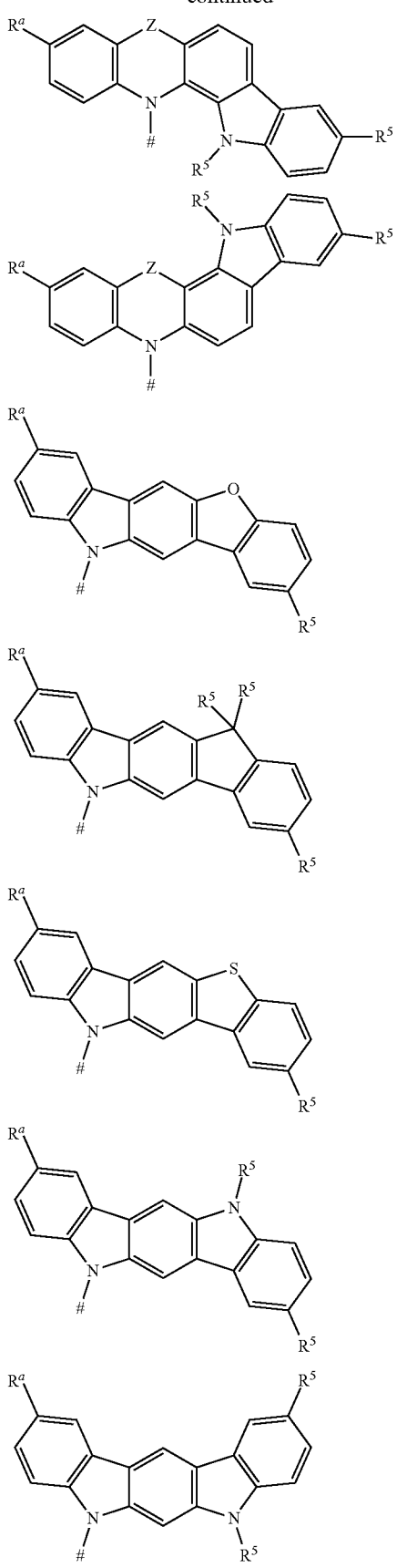
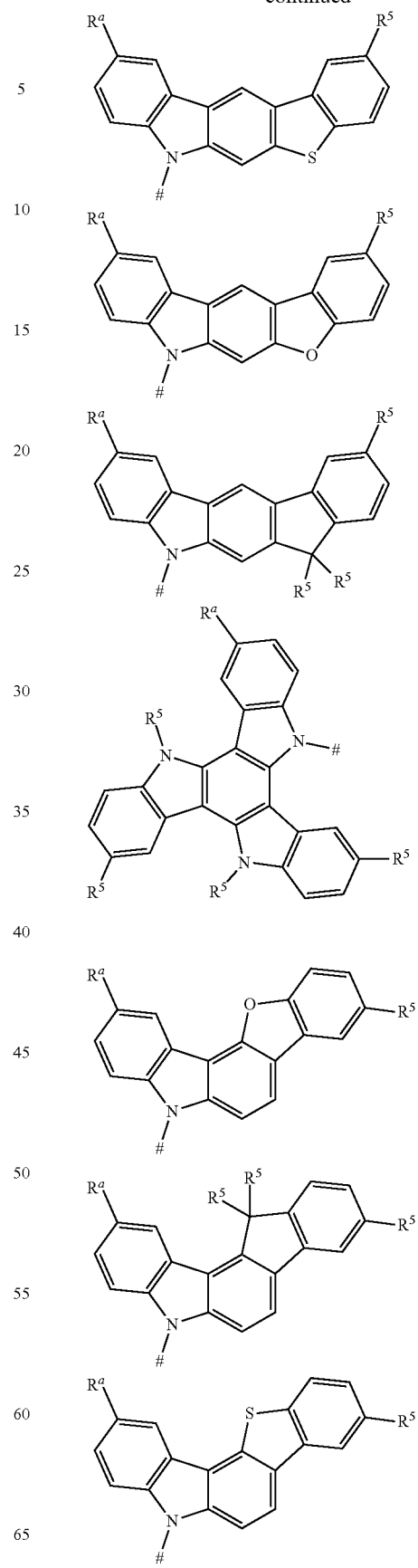

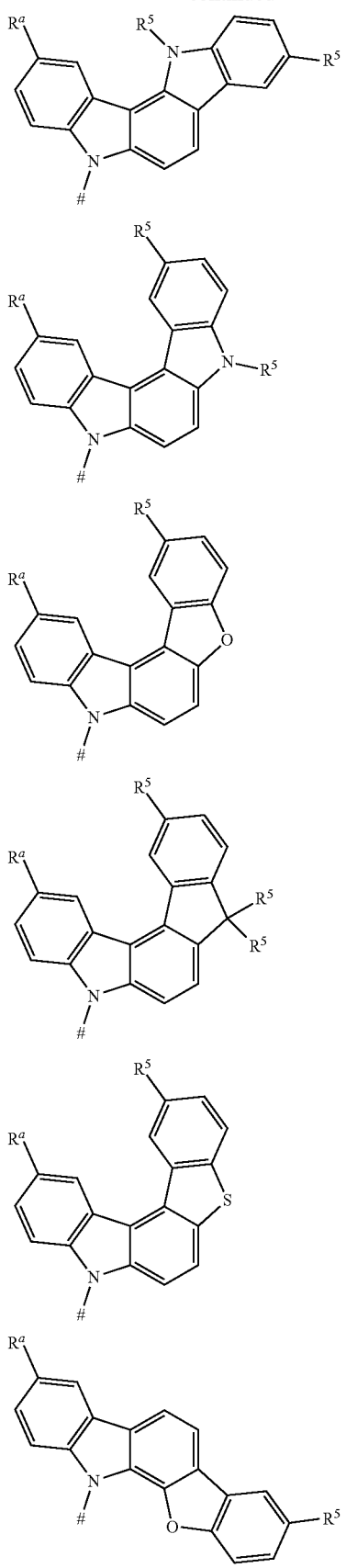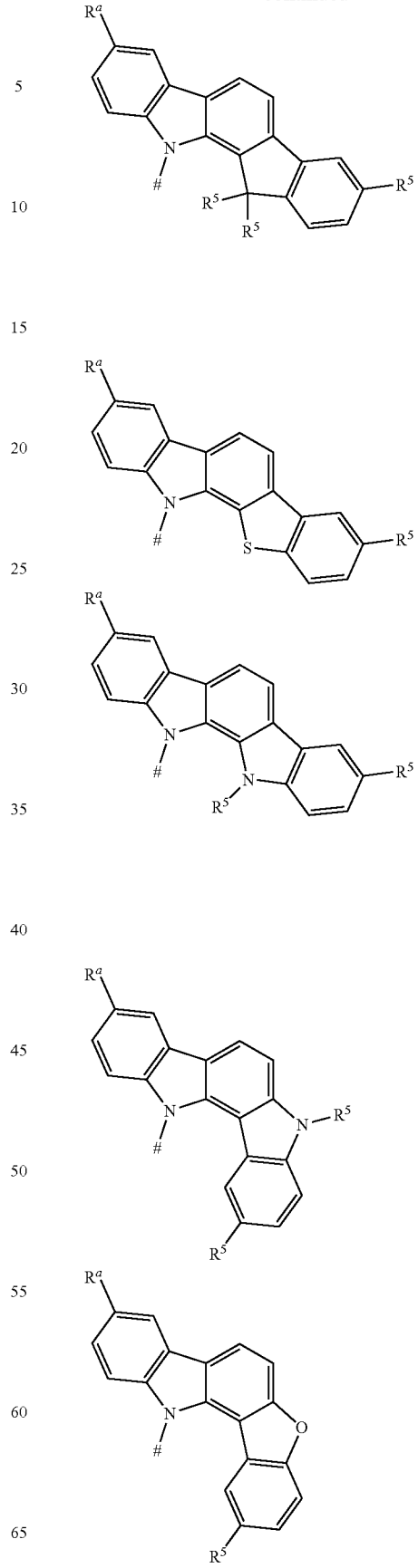

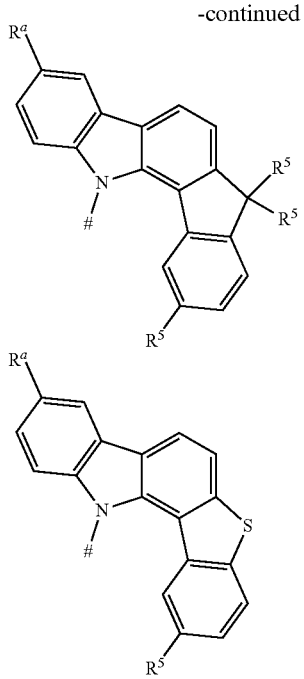

For each of the above-given second chemical moieties, the aforementioned definitions apply for #, Z, $R^a$, $R^3$, $R^4$ and $R^5$.

In one embodiment, $R^a$ and $R^5$ is at each occurrence independently from another selected from the group consisting of hydrogen (H), methyl (Me), i-propyl ($CH(CH_3)_2$) (${}^iPr$), t-butyl (${}^tBu$), phenyl (Ph),
triazinyl, which is optionally substituted with one or more substituents independently from each other selected from the group consisting of Me, ${}^iPr$, ${}^tBu$, CN, $CF_3$, and Ph; and
diphenylamine ($NPh2$).

In a further embodiment of the invention, the fourth chemical moiety comprises or consists of a structure of Formula IIq:

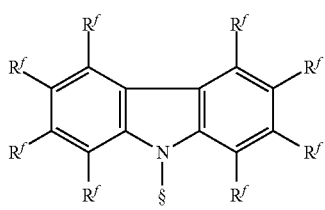

Formula IIq wherein § and $R^f$ are defined as above.

In a further embodiment of the invention, $R^f$ is at each occurrence independently from another selected from the group consisting of
hydrogen, Me, ${}^iPr$, ${}^tBu$, CN, $CF_3$,
Ph, which is optionally substituted with one or more substituents independently from each other selected from the group consisting of Me, ${}^iPr$, ${}^tBu$, CN, $CF_3$, and Ph,
pyridinyl, which is optionally substituted with one or more substituents independently from each other selected from the group consisting of Me, ${}^iPr$, ${}^tBu$, CN, $CF_3$, and Ph,
pyrimidinyl, which is optionally substituted with one or more substituents independently from each other selected from the group consisting of Me, ${}^iPr$, ${}^tBu$, CN, $CF_3$, and Ph,
carbazolyl, which is optionally substituted with one or more substituents independently from each other selected from the group consisting of Me, ${}^iPr$, ${}^tBu$, CN, $CF_3$, and Ph,
triazinyl, which is optionally substituted with one or more substituents independently from each other selected from the group consisting of Me, ${}^iPr$, ${}^tBu$, CN, $CF_3$, and Ph, and $N(Ph)_2$.

In a further embodiment of the invention, $R^f$ is at each occurrence independently from another selected from the group consisting of
hydrogen, Me, ${}^iPr$, ${}^tBu$, CN, $CF_3$,
Ph, which is optionally substituted with one or more substituents independently from each other selected from the group consisting of Me, ${}^iPr$, ${}^tBu$, CN, $CF_3$, and Ph,
pyridinyl, which is optionally substituted with one or more substituents independently from each other selected from the group consisting of Me, ${}^iPr$, ${}^tBu$, CN, $CF_3$, and Ph,
pyrimidinyl, which is optionally substituted with one or more substituents independently from each other selected from the group consisting of Me, ${}^iPr$, ${}^tBu$, CN, $CF_3$, and Ph, and
triazinyl, which is optionally substituted with one or more substituents independently from each other selected from the group consisting of Me, ${}^iPr$, ${}^tBu$, CN, $CF_3$, and Ph.

In a further embodiment of the invention, the fourth chemical moiety comprises or consists of a structure of Formula IIbq, a structure of Formula IIbq-2, a structure of Formula IIbq-3 or a structure of Formula IIbq-4:

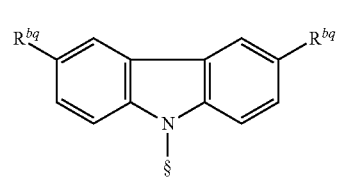

Formula IIbq

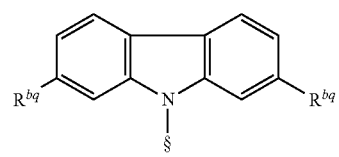

Formula IIbq-2

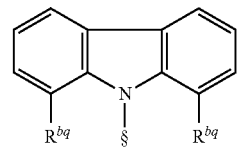

Formula IIbq-3

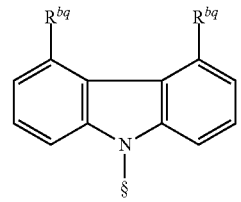

Formula IIbq-4

$R^{bq}$ is at each occurrence independently from another selected from the group consisting of $N(R^{5f})_2$, $OR^{5f}$, $Si(R^{5f})_3$, $B(OR^{5f})_2$, $OSO_2R^{5f}$, $CF_3$, CN, F, Br, I, $C_1$-$C_{40}$-alkyl,
which is optionally substituted with one or more substituents $R^{5f}$ and
wherein one or more non-adjacent CH$_2$-groups are optionally substituted by $R^{5f}C=CR^{5f}$, C≡C, $Si(R^{5f})_2$, $Ge(R^{5f})_2$, $Sn(R^{5f})_2$, C=O, C=S, C=Se, C=NR$^{5f}$, P(=O)(R$^{5f}$), SO, SO$_2$, NR$^{5f}$, O, S or CONR$^{5f}$;

$C_1$-$C_{40}$-alkoxy,
which is optionally substituted with one or more substituents $R^{5f}$ and
wherein one or more non-adjacent CH$_2$-groups are optionally substituted by $R^{5f}C=CR^{5f}$, C≡C, $Si(R^{5f})_2$, $Ge(R^{5f})_2$, $Sn(R^{5f})_2$, C=O, C=S, C=Se, C=NR$^{5f}$, P(=O)(R$^{5f}$), SO, SO$_2$, NR$^{5f}$, O, S or CONR$^{5f}$;

$C_1$-$C_{40}$-thioalkoxy,
which is optionally substituted with one or more substituents $R^{5f}$ and
wherein one or more non-adjacent CH$_2$-groups are optionally substituted by $R^{5f}C=CR^{5f}$, C≡C, $Si(R^{5f})_2$, $Ge(R^{5f})_2$, $Sn(R^{5f})_2$, C=O, C=S, C=Se, C=NR$^{5f}$, P(=O)(R$^{5f}$), SO, SO$_2$, NR$^{5f}$, O, S or CONR$^{5f}$;

$C_2$-$C_{40}$-alkenyl,
which is optionally substituted with one or more substituents $R^{5f}$ and
wherein one or more non-adjacent CH$_2$-groups are optionally substituted by $R^{5f}C=CR^{5f}$, C≡C, $Si(R^{5f})_2$, $Ge(R^{5f})_2$, $Sn(R^{5f})_2$, C=O, C=S, C=Se, C=NR$^{5f}$, P(=O)(R$^{5f}$), SO, SO$_2$, NR$^{5f}$, O, S or CONR$^{5f}$;

$C_2$-$C_{40}$-alkynyl,
which is optionally substituted with one or more substituents $R^{5f}$ and
wherein one or more non-adjacent CH$_2$-groups are optionally substituted by $R^{5f}C=CR^{5f}$, C≡C, $Si(R^{5f})_2$, $Ge(R^{5f})_2$, $Sn(R^{5f})_2$, C=O, C=S, C=Se, C=NR$^{5f}$, P(=O)(R$^{5f}$), SO, SO$_2$, NR$^{5f}$, O, S or CONR$^{5f}$;

$C_6$-$C_{60}$-aryl,
which is optionally substituted with one or more substituents $R^{5f}$; and $C_3$-$C_{57}$-heteroaryl,
which is optionally substituted with one or more substituents $R^{5f}$.

For additional variables, the aforementioned definitions apply.

In one additional embodiment of the invention, the fourth chemical moiety comprises or consists of a structure of Formula IIcq, a structure of Formula IIcq-2, a structure of Formula IIcq-3 or a structure of Formula IIcq-4:

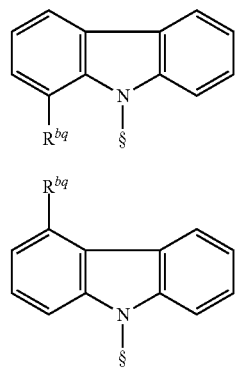

Formula IIcq

Formula IIcq-2

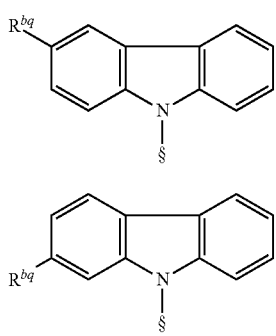

Formula IIcq-3

Formula IIcq-4 wherein the aforementioned definitions apply.

In a further embodiment of the invention, $R^{bq}$ is at each occurrence independently from another selected from the group consisting of Me, $^i$Pr, $^t$Bu, CN, CF$_3$, Ph, which is optionally substituted with one or more substituents independently from each other selected from the group consisting of Me, $^i$Pr, $^t$Bu, CN, CF$_3$, and Ph, pyridinyl, which is optionally substituted with one or more substituents independently from each other selected from the group consisting of Me, $^i$Pr, $^t$Bu, CN, CF$_3$, and Ph, pyrimidinyl, which is optionally substituted with one or more substituents independently from each other selected from the group consisting of Me, $^i$Pr, $^t$Bu, CN, CF$_3$, and Ph, carbazolyl, which is optionally substituted with one or more substituents independently from each other selected from the group consisting of Me, $^i$Pr, $^t$Bu, CN, CF$_3$, and Ph, triazinyl, which is optionally substituted with one or more substituents independently from each other selected from the group consisting of Me, $^i$Pr, $^t$Bu, CN, CF$_3$, and Ph, and N(Ph)$_2$.

In a further embodiment of the invention, $R^{bq}$ is at each occurrence independently from another selected from the group consisting of Me, $^i$Pr, $^t$Bu, CN, CF$_3$, Ph, which is optionally substituted with one or more substituents independently from each other selected from the group consisting of Me, $^i$Pr, $^t$Bu, CN, CF$_3$, and Ph, pyridinyl, which is optionally substituted with one or more substituents independently from each other selected from the group consisting of Me, $^i$Pr, $^t$Bu, CN, CF$_3$, and Ph, pyrimidinyl, which is optionally substituted with one or more substituents independently from each other selected from the group consisting of Me, $^i$Pr, $^t$Bu, CN, CF$_3$, and Ph, and triazinyl, which is optionally substituted with one or more substituents independently from each other selected from the group consisting of Me, $^i$Pr, $^t$Bu, CN, CF$_3$, and Ph.

In one embodiment of the invention, $R^{bq}$ is at each occurrence independently from another selected from the group consisting of Me, $^i$Pr, $^t$Bu, Ph, which is optionally substituted with one or more substituents independently from each other selected from the group consisting of Me, $^i$Pr, $^t$Bu, CN, CF$_3$ and Ph; and triazinyl, which is optionally substituted with one or more substituents independently from each other selected from the group consisting of Me, $^i$Pr, $^t$Bu, CN, CF$_3$ and Ph.

In the following, exemplary embodiments of the fourth chemical moiety are shown:

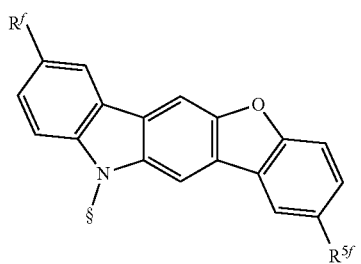

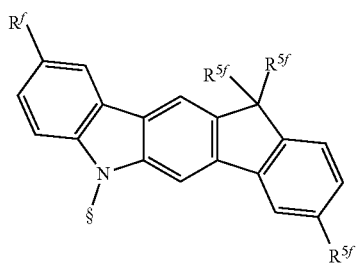

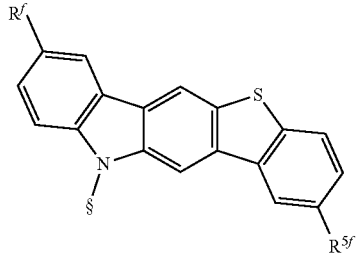

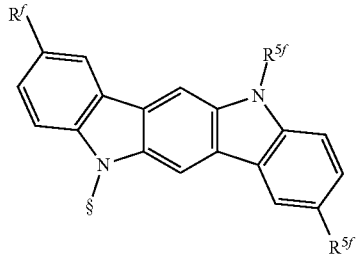

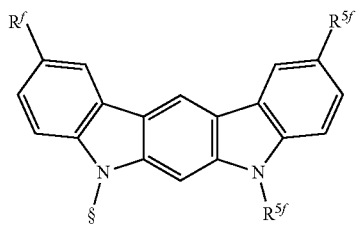

-continued

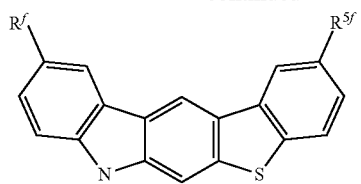

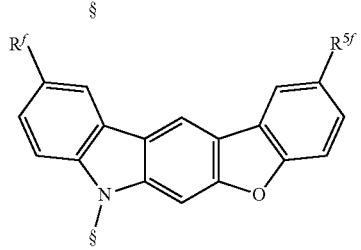

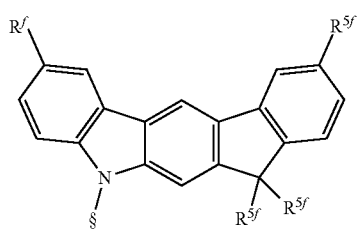

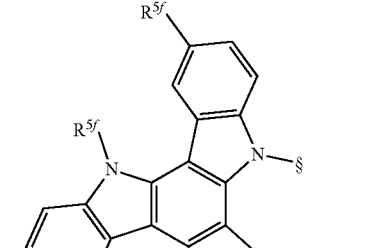

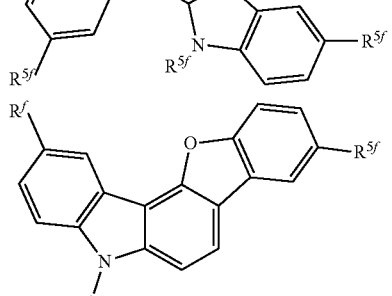

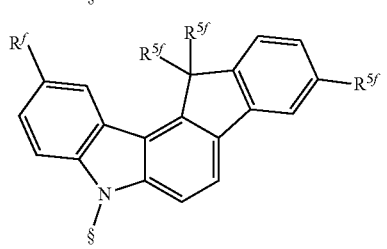

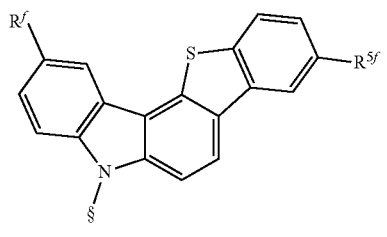

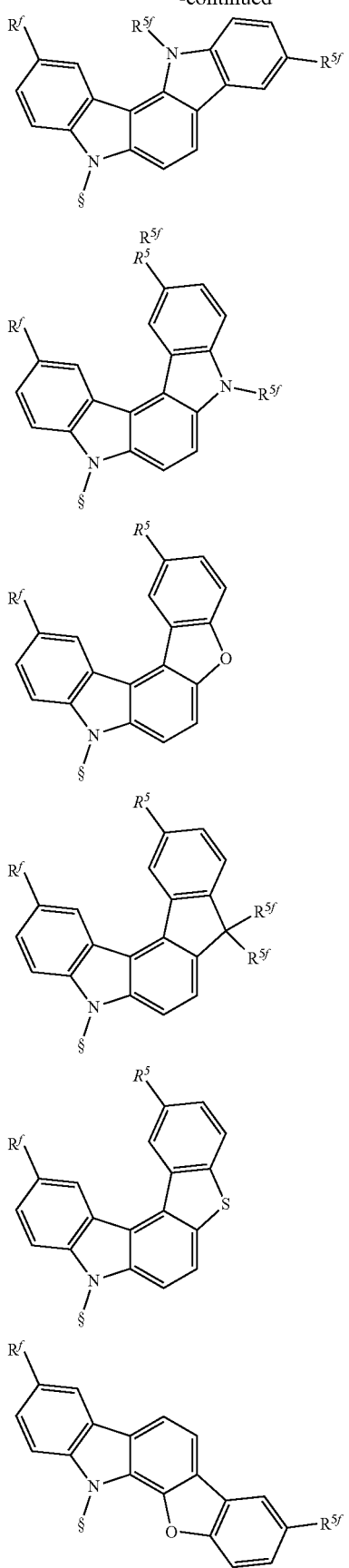
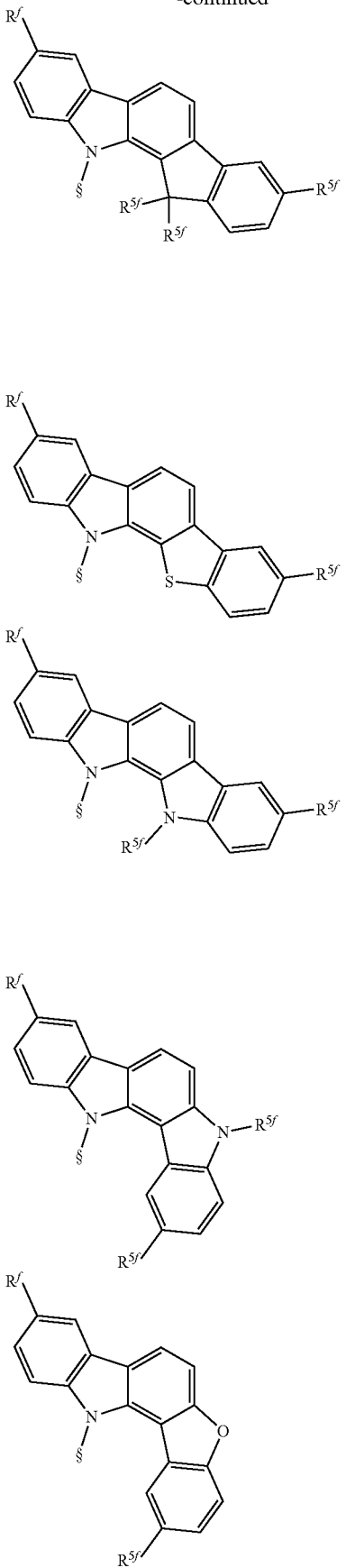

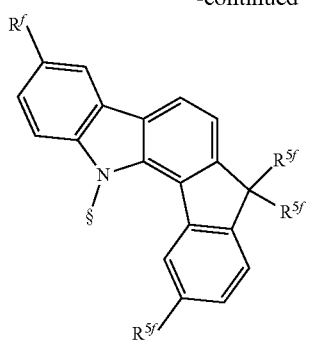

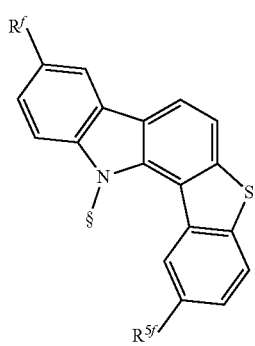

For $, R$^f$, and R$^{5f}$ of the fourth chemical moiety shown above, the aforementioned definitions apply.

In one embodiment, R at and R$^{5f}$ is at each occurrence independently from another selected from the group consisting of hydrogen (H), methyl (Me), i-propyl (CH(CH$_3$)$_2$) (${}^iPr$), t-butyl (${}^tBu$), phenyl (Ph), triazinyl, which is optionally substituted with one or more substituents independently from each other selected from the group consisting of Me, ${}^iPr$, ${}^tBu$, CN, CF$_3$, and Ph; and diphenylamine (NPh2).

The synthesis of the molecules of a structure of Formula I can be accomplished via standard reactions and reaction conditions known to the skilled artesian. Typically, in a first step a coupling reaction, preferably a palladium catalyzed coupling reaction, is performed.

General Synthesis Scheme for the TADF Material E$^B$:

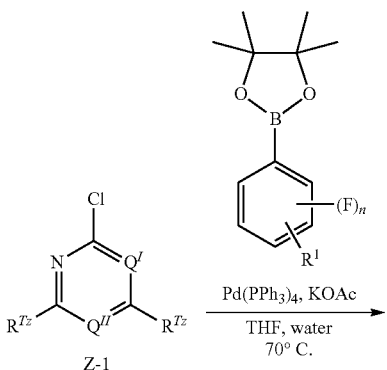

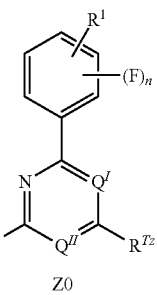

Z0

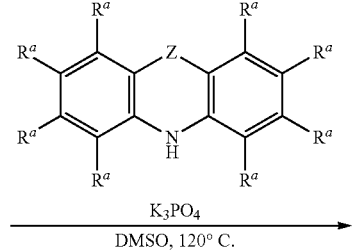

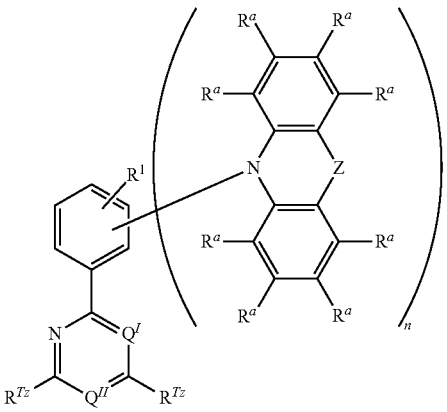

integer n: 1, 2

General Procedure for Synthesis AAV1:

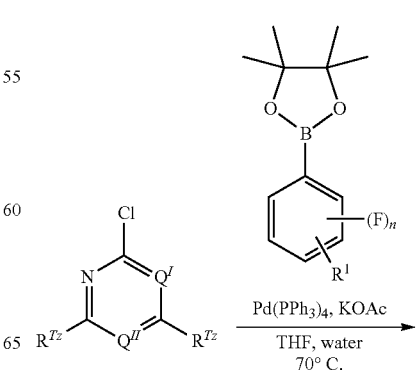

-continued

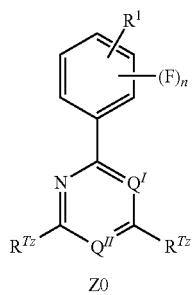

integer n: 1, 2

Z1 (e.g. 2-chloro-4,6-bisphenyl-1,3,5-triazine) (1.00 equivalents) R¹-fluoro-phenylboronic ester (1.00-1.50 equivalents), Pd(PPh₃)₄ (tetrakis(triphenylphosphine)palladium(0) (CAS:14221-01-3, 0.10 equivalents) and potassium carbonate (3.00 equivalents) are stirred overnight under nitrogen atmosphere in THF/Water (3:1) at 70° C. After cooling down to room temperature (RT), the reaction mixture is extracted with ethyl acetate/brine. The organic phases are collected, the organic solvent is removed and the crude product Z0 is purified by flash chromatography or by recrystallization.

General Procedure for Synthesis AAV3:

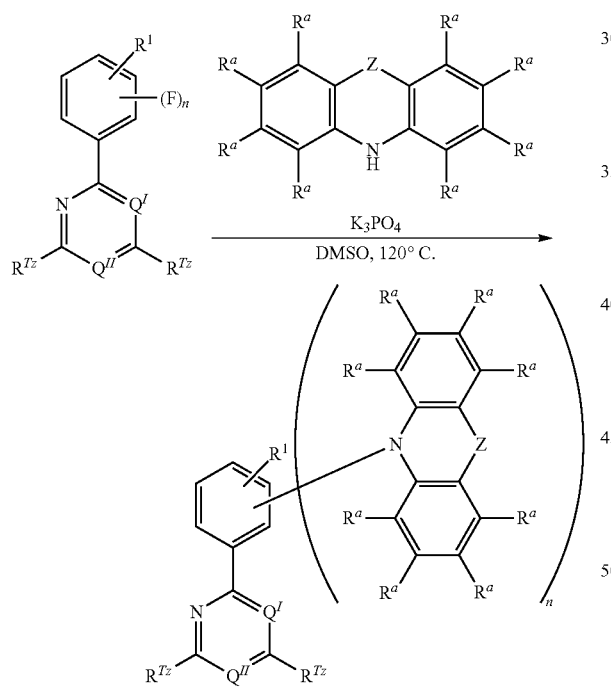

integer n: 1, 2

Z0 (1 equivalent), the corresponding donor molecule D-H (n equivalents, i.e. 1 equivalent or 2 equivalents, depending on the integer n) and tribasic potassium phosphate (3.00 equivalents) are suspended under nitrogen atmosphere in DMSO and stirred at 120° C. for 12 to 16 hours. Subsequently, the reaction mixture is poured into an excess of water in order to precipitate the product. The precipitate is filtered off, washed with water and dried under vacuum. The crude product is purified by recrystallization or by flash chromatography. The product is obtained as a solid.

In particular, the donor molecule D-H is a 3,6-substituted carbazole (e.g., 3,6-dimethylcarbazole, 3,6-diphenylcarbazole, 3,6-di-tert-butylcarbazole), a 2,7-substituted carbazole (e.g., 2,7-dimethylcarbazole, 2,7-diphenylcarbazole, 2,7-di-tert-butylcarbazole), a 1,8-substituted carbazole (e.g., 1,8-dimethylcarbazole, 1,8-diphenylcarbazole, 1,8-di-tert-butylcarbazole), a 1-substituted carbazole (e.g., 1-methylcarbazole, 1-phenylcarbazole, 1-tert-butylcarbazole), a 2-substituted carbazole (e.g., 2-methylcarbazole, 2-phenylcarbazole, 2-tert-butylcarbazole), or a 3-substituted carbazole (e.g., 3-methylcarbazole, 3-phenylcarbazole, 3-tert-butylcarbazole).

For example, a halogen-substituted carbazole, particularly 3-bromocarbazole, can be used as D-H.

In a subsequent reaction, a boronic acid ester functional group or boronic acid functional group may be, for example, introduced at the position of the one or more halogen substituents, which was introduced via D-H, to yield the corresponding carbazol-3-ylboronic acid ester or carbazol-3-ylboronic acid, e.g., via the reaction with bis(pinacolato)diboron (CAS No. 73183-34-3). Subsequently, one or more substituents $R^a$ may be introduced at the position of the boronic acid ester group or the boronic acid group via a coupling reaction with the corresponding halogenated reactant $R^a$-Hal, preferably $R^a$-Cl and $R^a$-Br.

Alternatively, one or more substituents $R^a$ may be introduced at the position of the one or more halogen substituents, which was introduced via D-H, via the reaction with a boronic acid of the substituent $R^a$[$R^a$—B(OH)₂] or a corresponding boronic acid ester.

Depopulation Agent $S^B$

In a preferred embodiment, the depopulation agent $S^B$ consists of a structure according to Formula 1s:

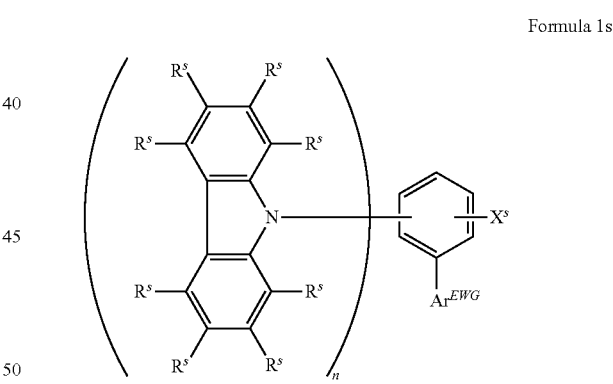

Formula 1s n is at each occurrence independently from another 1 or 2.

$X^s$ is at each occurrence independently from another selected CN or CF₃.

$Ar^{EWG}$ is at each occurrence independently from another a structure according to one of Formulas IIsa to IIsm:

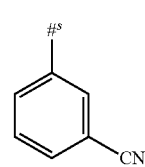

Formula IIsa

Formula IIsb 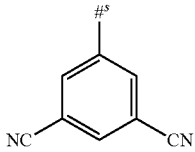

Formula IIsc 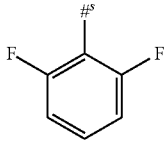

Formula IIsd 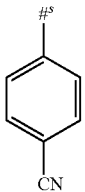

Formula IIse 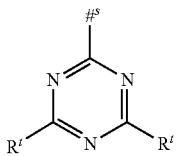

Formula IIsf 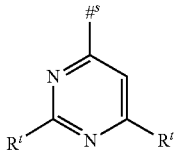

Formula IIs 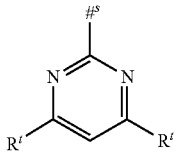

Formula IIsh 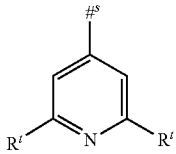

Formula IIsi 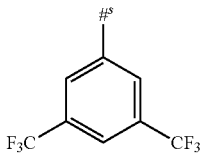

Formula IIsj 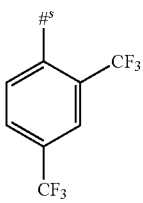

Formula IIsk 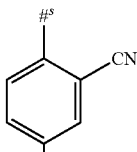

Formula IIsl 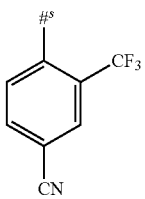

Formula IIsm 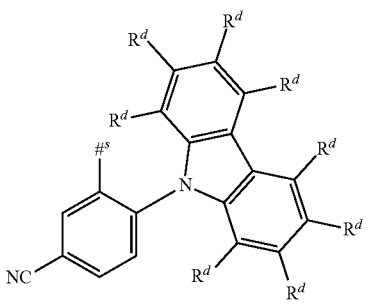

wherein $\#^s$ represents the binding site of the single bond linking $Ar^{EWG}$ to the substituted central phenyl ring of Formula 1s.

$R^t$ is at each occurrence independently from another selected from the group consisting of hydrogen, deuterium, $C_1$-$C_5$-alkyl, wherein one or more hydrogen atoms are optionally substituted by deuterium, and $C_6$-$C_{18}$-aryl, which is optionally substituted with one or more substituents $R^{6s}$.

$R^s$ is at each occurrence independently from another selected from the group consisting of hydrogen, deuterium, $N(R^{5s})_2$, $OR^{5s}$, $SR^{5s}$, $Si(R^{5s})_3$, $CF_3$, $CN$, $F$, $C_1$-$C_{40}$-alkyl which is optionally substituted with one or more substituents $R^{5s}$ and wherein one or more non-adjacent $CH_2$-groups are optionally substituted by $R^{5s}C=CR^{5s}$, $C\equiv C$, $Si(R^{5s})_2$, $Ge(R^{5s})_2$, $Sn(R^{5s})_2$, $C=O$, $C=S$, $C=Se$, $C=NR^{5s}$, $P(=O)(R^{5s})$, $SO$, $SO_2$, $NR^{5s}$, $O$, $S$ or $CONR^{5s}$;

$C_1$-$C_{40}$-thioalkoxy which is optionally substituted with one or more substituents $R^{5s}$ and wherein one or more non-adjacent $CH_2$-groups are optionally substituted by $R^{5s}C=CR^{5s}$, $C\equiv C$, $Si(R^{5s})_2$, $Ge(R^{5s})_2$, $Sn(R^{5s})_2$, $C=O$, $C=S$, $C=Se$, $C=NR^{5s}$, $P(=O)(R^{5s})$, $SO$, $SO_2$, $NR^{5s}$, $O$, $S$ or $CONR^{5s}$; and $C_6$-$C_{60}$-aryl which is optionally substituted with one or more substituents $R^{5s}$;

$C_3$-$C_{57}$-heteroaryl which is optionally substituted with one or more substituents $R^{5s}$.

$R^{5s}$ is at each occurrence independently from another selected from the group consisting of hydrogen, deuterium, $N(R^{6s})_2$, $OR^{6s}$, $SR^{6s}$, $Si(R^{6s})_3$, $CF_3$, $CN$, $F$, $C_1$-$C_{40}$-alkyl which is optionally substituted with one or more substituents $R^{6s}$ and wherein one or more non-adjacent CH$_2$-groups are optionally substituted by R$^{6s}$C=CR$^{6s}$, C≡C, Si(R$^{6s}$)$_2$, Ge(R$^{6s}$)$_2$, Sn(R$^{6s}$)$_2$, C=O, C=S, C=Se, C=NR$^{6s}$, P(=O)(R$^{6s}$), SO, SO$_2$, NR$^{6s}$, O, S or CONR$^{6s}$;

C$_6$-C$_{60}$-aryl which is optionally substituted with one or more substituents R$^{6s}$; and C$_3$-C$_{57}$-heteroaryl which is optionally substituted with one or more substituents R$^{6s}$.

R$^{6s}$ is at each occurrence independently from another selected from the group consisting of hydrogen, deuterium, OPh, CF$_3$, CN, F, C$_1$-C$_5$-alkyl, wherein one or more hydrogen atoms are optionally, independently from each other substituted by deuterium, CN, CF$_3$, or F;

C$_1$-C$_5$-alkoxy, wherein one or more hydrogen atoms are optionally, independently from each other substituted by deuterium, CN, CF$_3$, or F;

C$_1$-C$_5$-thioalkoxy, wherein one or more hydrogen atoms are optionally, independently from each other substituted by deuterium, CN, CF$_3$, or F;

C$_6$-C$_{18}$-aryl which is optionally substituted with one or more C$_1$-C$_5$-alkyl substituents;

C$_3$-C$_{17}$-heteroaryl which is optionally substituted with one or more C$_1$-C$_5$-alkyl substituents;

N(C$_6$-C$_{18}$-aryl)$_2$;

N(C$_3$-C$_{17}$-heteroaryl)$_2$, and

N(C$_3$-C$_{17}$-heteroaryl)(C$_6$-C$_{18}$-aryl).

R$^d$ is at each occurrence independently from another selected from the group consisting of hydrogen, deuterium, N(R$^{5s}$)$_2$, OR$^{5s}$, SR$^{5s}$, Si(R$^{5s}$)$_3$, CF$_3$, CN, F, C$_1$-C$_{40}$-alkyl which is optionally substituted with one or more substituents R$^{5s}$ and wherein one or more non-adjacent CH$_2$-groups are optionally substituted by R$^{5s}$C=CR$^{5s}$, C≡C, Si(R$^{5s}$)$_2$, Ge(R$^{5s}$)$_2$, Sn(R$^{5s}$)$_2$, C=O, C=S, C=Se, C=NR$^{5s}$, P(=O)(R$^{5s}$), SO, SO$_2$, NR$^{5s}$, O, S or CONR$^{5s}$;

C$_1$-C$_{40}$-thioalkoxy which is optionally substituted with one or more substituents R$^{5s}$ and wherein one or more non-adjacent CH$_2$-groups are optionally substituted by R$^{5s}$C=CR$^{5s}$, C≡C, Si(R$^{5s}$)$_2$, Ge(R$^{5s}$)$_2$, Sn(R$^{5s}$)$_2$, C=O, C=S, C=Se, C=NR$^{5s}$, P(=O)(R$^{5s}$), SO, SO$_2$, NR$^{5s}$, O, S or CONR$^{5s}$; and C$_6$-C$_{60}$-aryl which is optionally substituted with one or more substituents R$^{5s}$;

C$_3$-C$_{57}$-heteroaryl which is optionally substituted with one or more substituents R$^{5s}$.

According to the invention, the substituents R$^s$ or R$^{5s}$ may independently from each other optionally form a mono- or polycyclic, (hetero)aliphatic, (hetero)aromatic and/or benzo-fused ring system with one or more substituents R$^s$ or R$^{5s}$.

According to the invention, the one or more substituents R$^d$ independently from each other optionally may form a mono- or polycyclic, (hetero)aliphatic, (hetero)aromatic and/or benzo-fused ring system with one or more substituents R$^d$.

In one embodiment of the invention, n=2.
In one embodiment of the invention, X$^s$ is CN.
In a preferred embodiment, n=2 and X$^s$ is CN.
In one embodiment of the invention, R$^s$ is at each occurrence independently from another selected from the group consisting of hydrogen, deuterium, Me, $^i$Pr, $^t$Bu, CN, CF$_3$, Ph, which is optionally substituted with one or more substituents independently from each other selected from the group consisting of Me, $^i$Pr, $^t$Bu, CN, CF$_3$ and Ph;

pyridinyl, which is optionally substituted with one or more substituents independently from each other selected from the group consisting of Me, $^i$Pr, $^t$Bu, CN, CF$_3$ and Ph;

pyrimidinyl, which is optionally substituted with one or more substituents independently from each other selected from the group consisting of Me, $^i$Pr, $^t$Bu, CN, CF$_3$ and Ph;

carbazolyl, which is optionally substituted with one or more substituents independently from each other selected from the group consisting of Me, $^i$Pr, $^t$Bu, CN, CF$_3$ and Ph;

triazinyl, which is optionally substituted with one or more substituents independently from each other selected from the group consisting of Me, $^i$Pr, $^t$Bu, CN, CF$_3$ and Ph; and N(Ph)$_2$.

In one embodiment of the invention, R$^d$ is at each occurrence independently from another selected from the group consisting of hydrogen, deuterium, Me, $^i$Pr, $^t$Bu, CN, CF$_3$, Ph, which is optionally substituted with one or more substituents independently from each other selected from the group consisting of Me, $^i$Pr, $^t$Bu, CN, CF$_3$ and Ph;

pyridinyl, which is optionally substituted with one or more substituents independently from each other selected from the group consisting of Me, $^i$Pr, $^t$Bu, CN, CF$_3$ and Ph;

pyrimidinyl, which is optionally substituted with one or more substituents independently from each other selected from the group consisting of Me, $^i$Pr, $^t$Bu, CN, CF$_3$ and Ph;

carbazolyl, which is optionally substituted with one or more substituents independently from each other selected from the group consisting of Me, $^i$Pr, $^t$Bu, CN, CF$_3$ and Ph;

triazinyl, which is optionally substituted with one or more substituents independently from each other selected from the group consisting of Me, $^i$Pr, $^t$Bu, CN, CF$_3$ and Ph; and N(Ph)$_2$.

In one embodiment of the invention, depopulation agent S$^B$ is chosen from molecules of a structure of Formula IIIs:

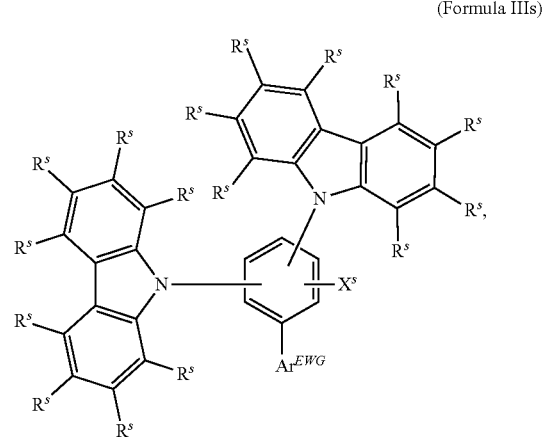

(Formula IIIs)

wherein R$^s$, Ar$^{EWG}$ and X$^s$ are defined as above.

In one embodiment of the invention, depopulation agent $S^B$ is chosen from molecules of a structure of Formula IIIas:

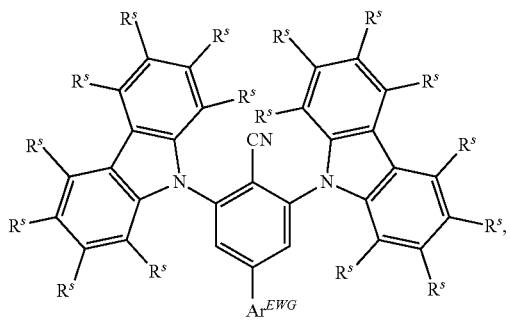

(Formula IIIas)

wherein $R^s$ and $Ar^{EWG}$ are defined as above.

In one embodiment of the invention, the depopulation agent $S^B$ is chosen from molecules of a structure of Formula IIIaas:

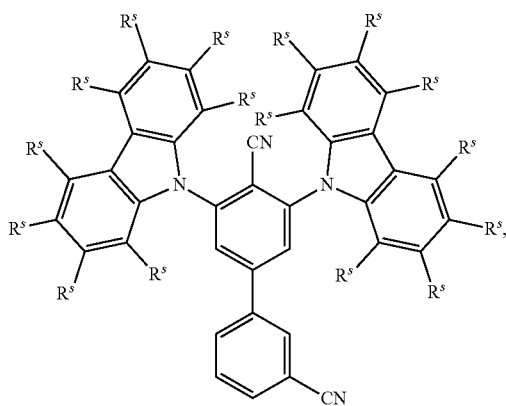

(Formula IIIaas)

wherein $R^s$ is defined as above.

In one embodiment of the invention, the depopulation agent $S^B$ is chosen from molecules of a structure of Formula IIIabs:

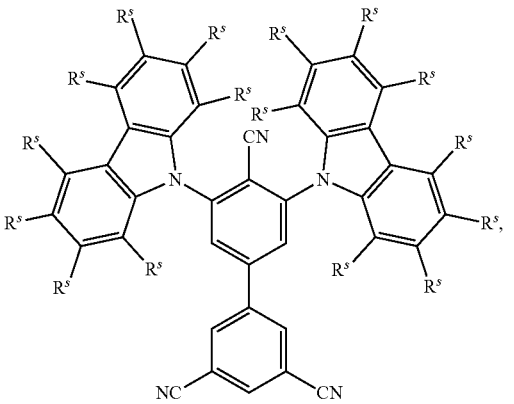

(Formula IIIabs)

wherein $R^s$ is defined as above.

In one embodiment of the invention, the depopulation agent $S^B$ is chosen from molecules of a structure of Formula IIIacs:

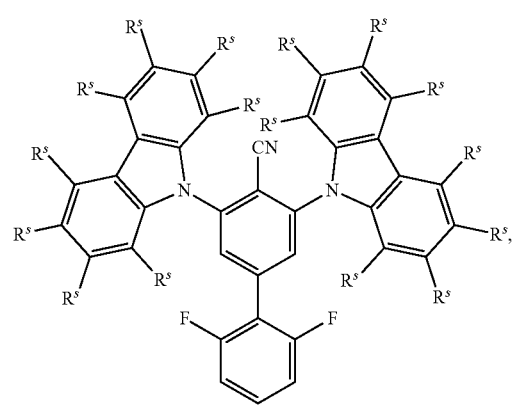

(Formula IIIacs)

wherein $R^s$ is defined as above.

In one embodiment of the invention, the depopulation agent $S^B$ is chosen from molecules of a structure of Formula IIIaes:

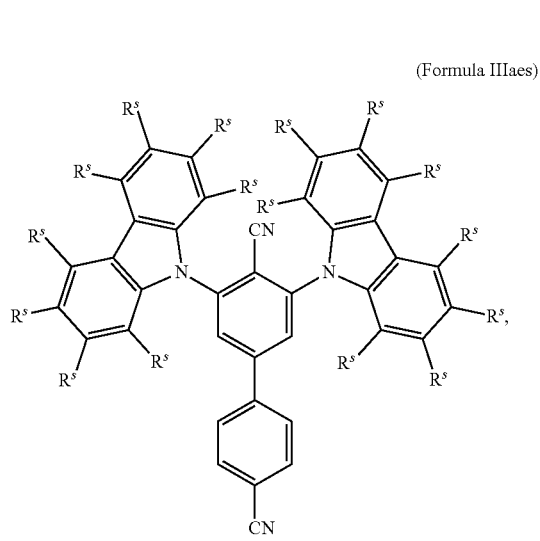

(Formula IIIaes)

wherein $R^s$ is defined as above.

In one embodiment of the invention, the depopulation agent $S^B$ is chosen from molecules of a structure of Formula IIIafs:

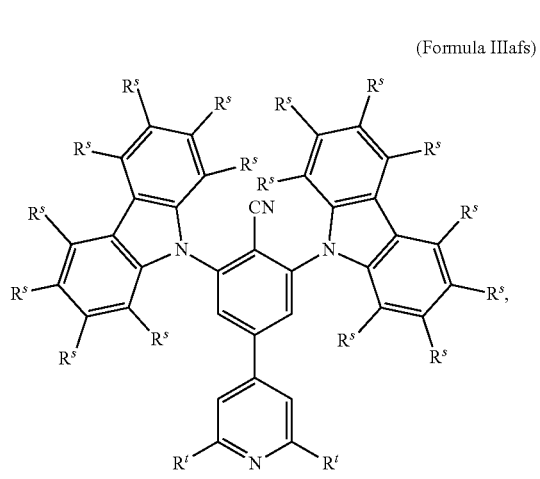

(Formula IIIafs)

wherein $R^s$ is defined as above.

In one embodiment of the invention, the depopulation agent $S^B$ is chosen from molecules of a structure of Formula IIIags:

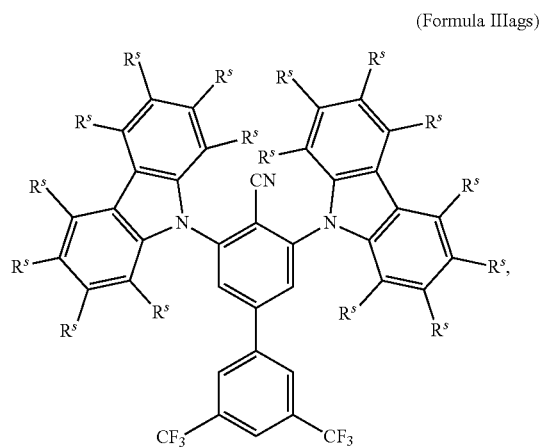

(Formula IIIags)

wherein $R^s$ is defined as above.

In one embodiment of the invention, the depopulation agent $S^B$ is chosen from molecules of a structure of Formula IIIahs:

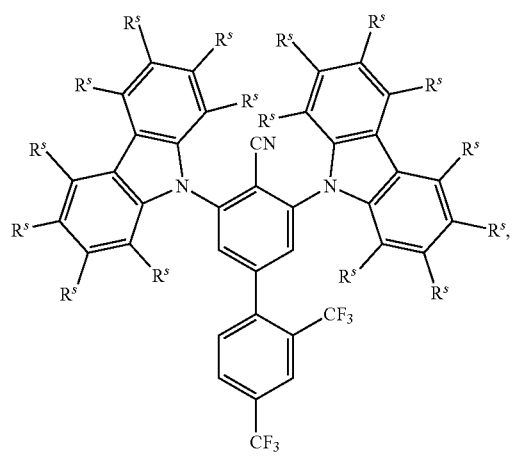

(Formula IIIahs)

wherein $R^s$ is defined as above.

In one embodiment of the invention, the depopulation agent $S^B$ is chosen from molecules of a structure of Formula IIIais:

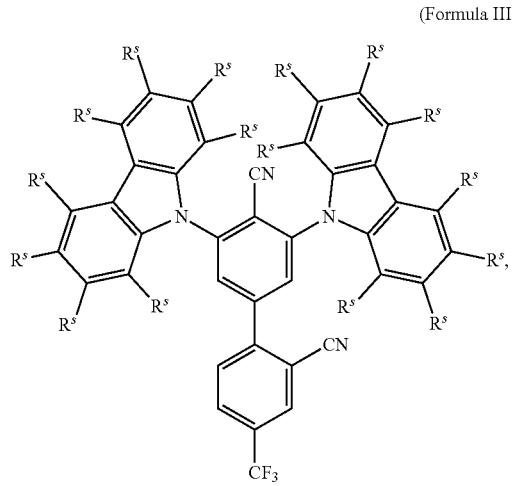
(Formula IIIais)

wherein $R^s$ is defined as above.

In one embodiment of the invention, the depopulation agent $S^B$ is chosen from molecules of a structure of Formula IIIaks:

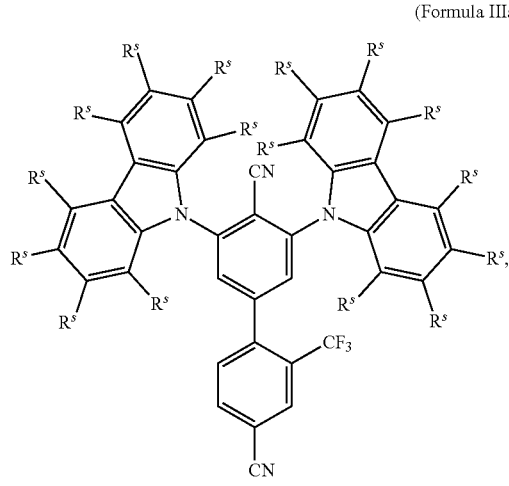
(Formula IIIaks)

wherein $R^s$ is defined as above.

In one embodiment of the invention, the depopulation agent $S^B$ is chosen from molecules of a structure of Formula IVs:

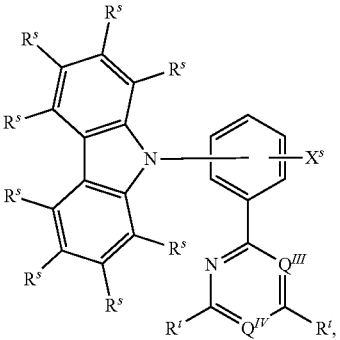
(Formula IVs)

wherein $R^s$, $X^s$, $Q^{III}$, $Q^{IV}$ and $R^t$ are defined as above.

In one embodiment of the invention, the depopulation agent $S^B$ I chosen from molecules of a structure of Formula IVas:

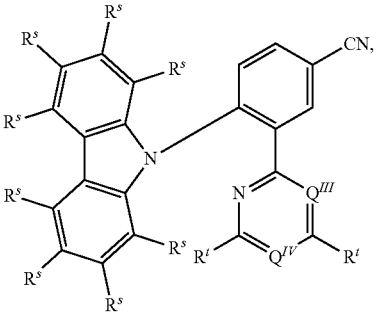
(Formula IVas)

wherein $R^s$, $Q^{III}$, $Q^{IV}$ and $R^t$ are defined as above.

In one embodiment of the invention, the depopulation agent $S^B$ is chosen from molecules of a structure of Formula IVaas:

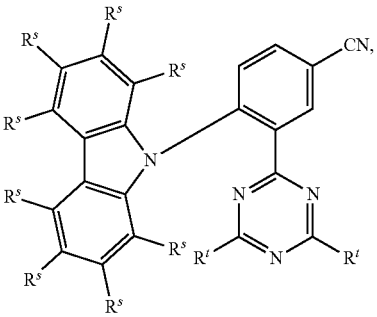
(Formula IVaas)

wherein $R^s$ and $R^t$ are defined as above.

In one embodiment of the invention, the depopulation agent $S^B$ is chosen from molecules of a structure of Formula IVabs:

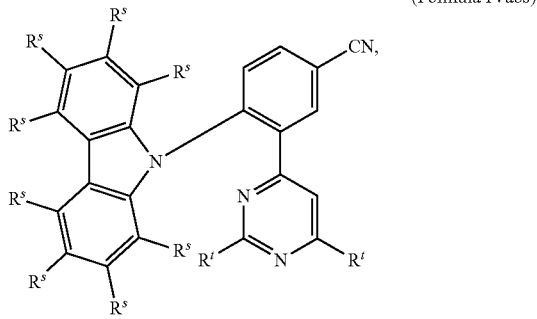

(Formula IVabs)

wherein $R^s$ and $R^t$ are defined as above.

In one embodiment of the invention, the depopulation agent $S^B$ is chosen from molecules of a structure of Formula IVacs:

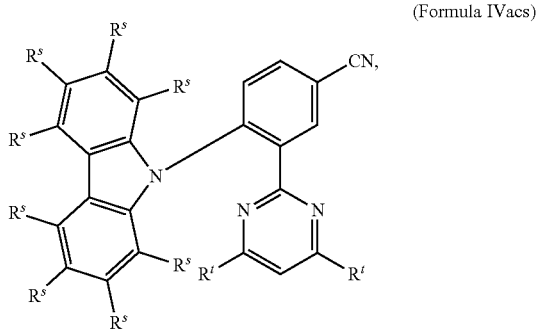

(Formula IVacs)

wherein $R^s$ and $R^t$ are defined as above.

In one embodiment of the invention, the depopulation agent $S^B$ is chosen from molecules of a structure of Formula Vs:

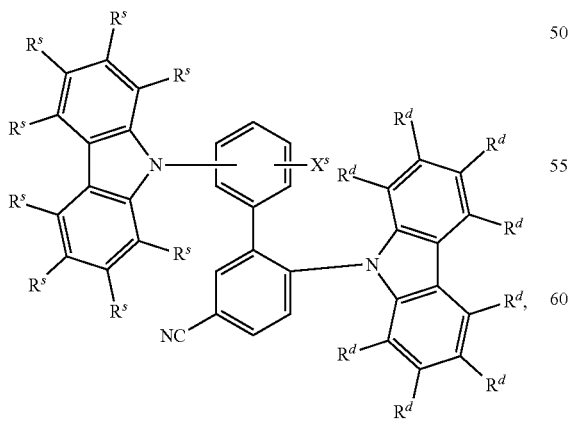

(Formula Vs)

wherein $R^s$, $X^s$, and $R^d$ are defined as above.

In one embodiment of the invention, the depopulation agent $S^B$ is chosen from molecules of a structure of Formula Vas:

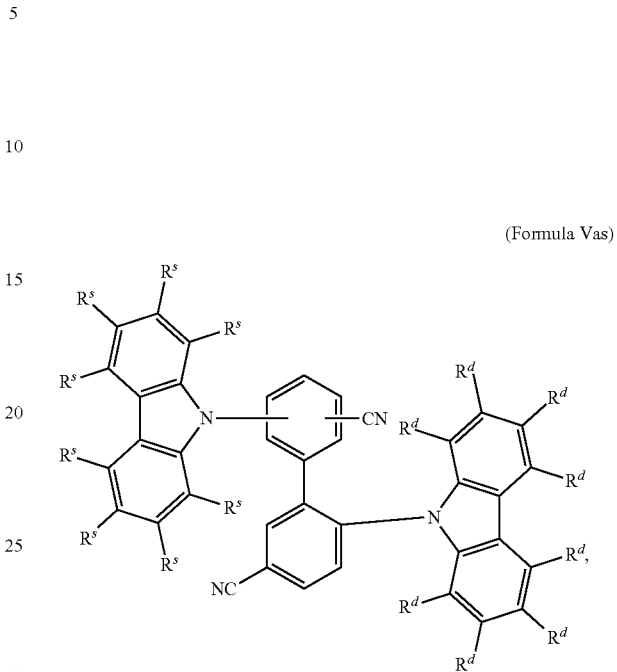

(Formula Vas)

wherein $R^s$ and $R^d$, are defined as above.

In one embodiment of the invention, the depopulation agent $S^B$ is chosen from molecules of a structure of Formula Vaas:

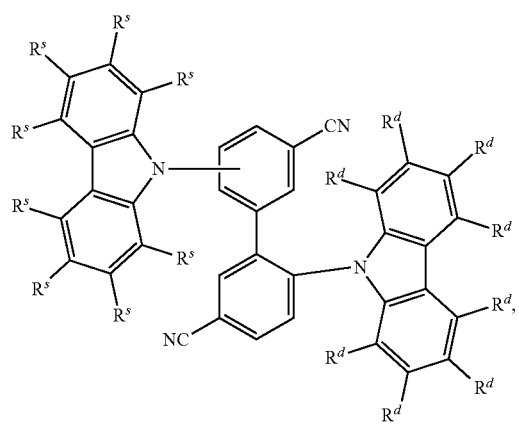

(Formula Vaas)

wherein $R^s$ and $R^d$ are defined as above.

In one embodiment of the invention, the depopulation agent $S^B$ is chosen from molecules of a structure of Formula Vabs:

(Formula Vabs)

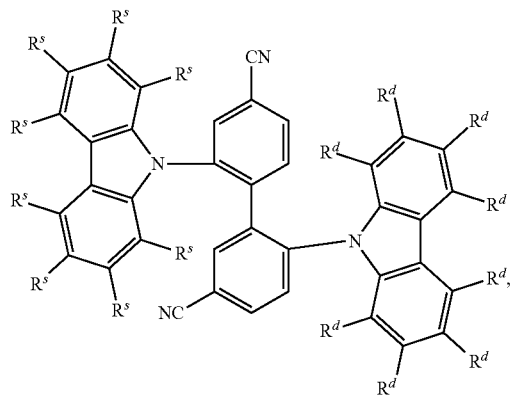

wherein $R^s$ and $R^d$ are defined as above.

The synthesis of the molecules of a structure of Formula 1s can be accomplished via standard reactions and reaction conditions known to the skilled artesian. Typically, in a first step a coupling reaction, preferably a palladium catalyzed coupling reaction, is performed.

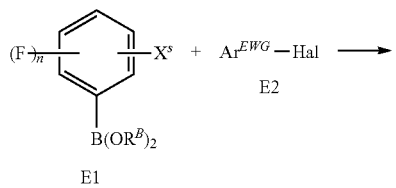

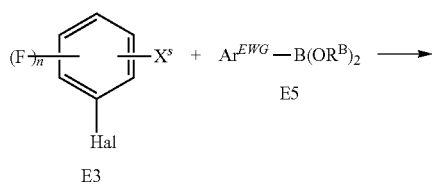

E1 can be any boronic acid ($R^B$=H) or an equivalent boronic acid ester ($R^B$=alkyl or aryl), in particular two $R^B$ form a ring to give e.g. boronic acid pinacol esters, of fluoro-(trifluoromethyl)phenyl, difluoro-(trifluoromethyl)phenyl, fluoro-(cyano)phenyl or difluoro-(cyano)phenyl. As second reactant E2 preferably $Ar^{EWG}$-Br is used. Reaction conditions of such palladium catalyzed coupling reactions are known the person skilled in the art, e.g. from WO 2017/005699A1, and it is known that the reacting groups of E1 and E2 can be interchanged to optimize the reaction yields.

-continued

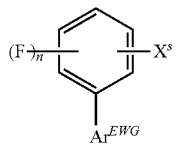

In a second step, the molecules according to Formula 1s are obtained via the reaction of a nitrogen heterocycle in a nucleophilic aromatic substitution with the aryl halide, preferably aryl fluoride, or aryl dihalide, preferably aryl difluoride, E3. Typical conditions include the use of a base, such as tribasic potassium phosphate or sodium hydride, for example, in an aprotic polar solvent, such as dimethyl sulfoxide (DMSO) or N,N-dimethylformamide (DMF), for example.

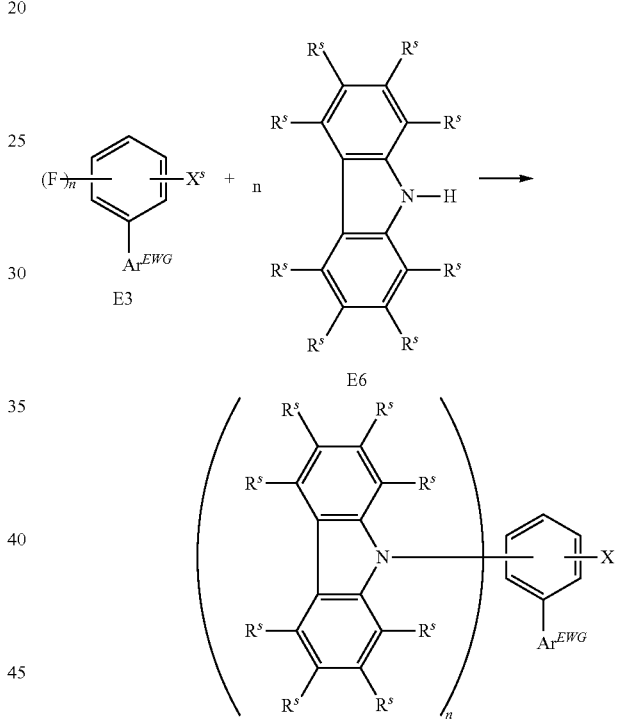

In particular, the donor molecule E6 is a 3,6-substituted carbazole (e.g., 3,6-dimethylcarbazole, 3,6 diphenylcarbazole, 3,6-di-tert-butylcarbazole), a 2,7-substituted carbazole (e.g., 2,7 dimethylcarbazole, 2,7-diphenylcarbazole, 2,7-di-tert-butylcarbazole), a 1,8-substituted carbazole (e.g., 1,8-dimethylcarbazole, 1,8-diphenylcarbazole, 1,8-di-tert-butylcarbazole), a 1 substituted carbazole (e.g., 1-methylcarbazole, 1-phenylcarbazole, 1-tert-butylcarbazole), a 2 substituted carbazole (e.g., 2-methylcarbazole, 2-phenylcarbazole, 2-tert-butylcarbazole), or a 3 substituted carbazole (e.g., 3-methylcarbazole, 3-phenylcarbazole, 3-tert-butylcarbazole).

Alternatively, a halogen-substituted carbazole, particularly 3-bromocarbazole, can be used as E6.

In a subsequent reaction a boronic acid ester functional group or boronic acid functional group may be exemplarily introduced at the position of the one or more halogen substituents, which was introduced via E6, to yield the corresponding carbazol-3-ylboronic acid ester or carbazol- 3-ylboronic acid, e.g., via the reaction with bis(pinacolato) diboron (CAS No. 73183-34-3). Subsequently, one or more substituents $R^s$ may be introduced in place of the boronic acid ester group or the boronic acid group via a coupling reaction with the corresponding halogenated reactant $R^s$-Hal, preferably $R^s$-Cl and $R^s$-Br.

Alternatively, one or more substituents $R^s$ may be introduced at the position of the one or more halogen substituents, which was introduced via D-H, via the reaction with a boronic acid of the substituent $R^s[R^s—B(OH)_2]$ or a corresponding boronic acid ester. An alternative synthesis route comprises the introduction of a nitrogen heterocycle via copper- or palladium-catalyzed coupling to an aryl halide or aryl pseudohalide, preferably an aryl bromide, an aryl iodide, aryl triflate or an aryl tosylate.

As used throughout the present application, the terms "aryl" and "aromatic" may be understood in the broadest sense as any mono, bi- or polycyclic aromatic moieties. If not otherwise indicated, an aryl may also be optionally substituted by one or more substituents which are exemplified further throughout the present application. Accordingly, the term "arylene" refers to a divalent residue that bears two binding sites to other molecular structures and thereby serving as a linker structure. As used throughout the present application, the terms "heteroaryl" and "heteroaromatic" may be understood in the broadest sense as any mono, bi- or polycyclic heteroaromatic moieties that include at least one heteroatom, in particular which bear from one to three heteroatoms per aromatic ring.

Exemplarily, a heteroaromatic compound may be pyrrole, furan, thiophene, imidazole, oxazole, thiazole, triazole, pyrazole, pyridine, pyrazine and pyrimidine, and the like. If not otherwise indicated, a heteroaryl may also be optionally substituted by one or more substituents which are exemplified further throughout the present application. Accordingly, the term "heteroarylene" refers to a divalent residue that bears two binding sites to other molecular structures and thereby serving as a linker structure.

As used throughout the present application, the term "alkyl" may be understood in the broadest sense as both, linear or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. If not otherwise indicated, an alkyl may also be optionally substituted by one or more substituents which are exemplified further throughout the present application. Accordingly, the term "alkylene" refers to a divalent residue that bears two binding sites to other molecular structures and thereby serving as a linker structure.

If not otherwise indicated, as used herein, in particular in the context of aryl, arylene, heteroaryl, alkyl and the like, the term "substituted" may be understood in the broadest sense. Preferably, such substitution means a residue selected from the group consisting of $C_1$-$C_{20}$-alkyl, $C_7$-$C_{19}$-alkaryl, and $C_6$-$C_{18}$-aryl. Accordingly, preferably, no charged moiety, more preferably no functional group is present in such substitution.

It will be noticed that hydrogen can, at each occurrence, be replaced by deuterium.

Unless otherwise specified, any of the layers of the various embodiments may be deposited by any suitable method. The layers in the context of the present invention, including the light-emitting layer B, may optionally be prepared by means of liquid processing (also designated as "film processing", "fluid processing", "solution processing" or "solvent processing"). This means that the components comprised in the respective layer are applied to the surface of a part of a device in liquid state. Preferably, the layers in the context of the present invention, including the light-emitting layer B, may be prepared by means of spin-coating. This method well-known to those skilled in the art allows obtaining thin and (essentially) homogeneous layers.

Alternatively, the layers in the context of the present invention, including the light-emitting layer B, may be prepared by other methods based on liquid processing such as, e.g., casting (e.g., drop-casting) and rolling methods, and printing methods (e.g., inkjet printing, gravure printing, blade coating). This may optionally be carried out in an inert atmosphere (e.g., in a nitrogen atmosphere).

In another preferred embodiment, the layers in the context of the present invention may be prepared by any other method known in the art, including but not limited to vacuum processing methods well-known to those skilled in the art such as, e.g., thermal (co-)evaporation, organic vapor phase deposition (OVPD), and deposition by organic vapor jet printing (OVJP).

When preparing layers by means of liquid processing, the solutions including the components of the layers (i.e., with respect to the light-emitting layer B of the present invention, at least one host compound $H^B$ and, typically, at least one TADF material $E^B$, at least one depopulation agent $S^B$ and optionally one or more other host compounds $H^{B2}$) may further comprise a volatile organic solvent. Such volatile organic solvent may optionally be one selected from the group consisting of tetrahydrofuran, dioxane, chlorobenzene, diethylene glycol diethyl ether, 2-(2-ethoxyethoxy) ethanol, gamma-butyrolactone, N-methyl pyrrolidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate). Also a combination of two or more solvents may be used. After applied in liquid state, the layer may subsequently be dried and/or hardened by any means of the art, exemplarily at ambient conditions, at increased temperature (e.g., about 50° C. or about 60° C.) or at diminished pressure.

Optionally, an organic electroluminescent device (e.g., an OLED) may exemplarily be an essentially white organic electroluminescent device or a blue organic electroluminescent device. Exemplarily such white organic electroluminescent device may comprise at least one (deep) blue emitter compound (e.g., TADF material $E^B$) and one or more emitter compounds emitting green and/or red light. Then, there may also optionally be energy transmittance between two or more compounds as described above.

The organic electroluminescent device as a whole may also form a thin layer of a thickness of not more than 5 mm, more than 2 mm, more than 1 mm, more than 0.5 mm, more than 0.25 mm, more than 100 µm, or more than 10 µm.

An organic electroluminescent device (e.g., an OLED) may be a small-sized (e.g., having a surface not larger than 5 mm², or even not larger than 1 mm²), medium-sized (e.g., having a surface in the range of 0.5 to 20 cm²), or a large-sized (e.g., having a surface larger than 20 cm²). An organic electroluminescent device (e.g., an OLED) according to the present invention may optionally be used for generating screens, as large-area illuminating device, as luminescent wallpaper, luminescent window frame or glass, luminescent label, luminescent poser or flexible screen or display. Next to the common uses, an organic electroluminescent device (e.g., an OLED) may exemplarily also be used as luminescent films, "smart packaging" labels, or innovative design elements. Further they are usable for cell detection and examination (e.g., as bio labelling).

One of the main purposes of an organic electroluminescent device is the generation of light. Thus, the present invention further relates to a method for generating light of a desired wavelength range, comprising the step of providing an organic electroluminescent device according to any the present invention.

Accordingly, a further aspect of the present invention relates to a method for generating light of a desired wavelength range, comprising the steps of
(i) providing an organic electroluminescent device according to the present invention; and
(ii) applying an electrical current to said organic electroluminescent device.

A further aspect of the present invention relates to a process of making the organic electroluminescent devices by assembling the elements described above. The present invention also relates to a method for generating blue, green, yellow, orange, red or white light, in particular blue or white light by using said organic electroluminescent device.

The Figure and Examples and claims further illustrate the invention.

EXAMPLES

Cyclic Voltammetry

Cyclic voltammograms of solutions having concentration of 10–3 mol/l of the organic molecules in dichloromethane or a suitable solvent and a suitable supporting electrolyte (e.g. 0.1 mol/l of tetrabutylammonium hexafluorophosphate) are measured. The measurements are conducted at room temperature and under nitrogen atmosphere with a three-electrode assembly (Working and counter electrodes: Pt wire, reference electrode: Pt wire) and calibrated using $FeCp_2/FeCp_2^+$ as internal standard. HOMO data was corrected using ferrocene as internal standard against SCE.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration were used. The Turbomole program package was used for all calculations.

Photophysical Measurements

Sample pretreatment: Spin-coating
Apparatus: Spin150, SPS euro.
The sample concentration is 10 mg/ml, dissolved in a suitable solvent.
Program: 1) 3 s at 400 U/min; 20 s at 1000 U/min at 1000 Upm/s. 3) 10 s at 4000 U/min at 1000 Upm/s. After coating, the films are tried at 70° C. for 1 min.
Photoluminescence spectroscopy and TCSPC (Time-correlated single-photon counting)
Steady-state emission spectroscopy is recorded using a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.
Excited state lifetimes are determined employing the same system using the TCSPC method with FM-2013 equipment and a Horiba Yvon TCSPC hub.

Excitation Sources:
NanoLED 370 (wavelength: 371 nm, puls duration: 1,1 ns)
NanoLED 290 (wavelength: 294 nm, puls duration: <1 ns)
SpectraLED 310 (wavelength: 314 nm)
SpectraLED 355 (wavelength: 355 nm).
Data analysis (exponential fit) was done using the software suite DataStation and DAS6 analysis software. The fit is specified using the chi-squared-test.

Photoluminescence Quantum Yield Measurements

For photoluminescence quantum yield (PLAY) measurements an Absolute PL Quantum Yield Measurement $C_{9920}$-03G system (Hamamatsu Photonics) is used. Quantum yields and CIE coordinates were determined using the software U6039-05 version 3.6.0.

Emission maxima are given in nm, quantum yields $\phi$ in % and CIE coordinates as x,y values.

PLQY was determined using the following protocol:
1) Quality assurance: Anthracene in ethanol (known concentration) is used as reference
2) Excitation wavelength: the absorption maximum of the organic molecule is determined and the molecule is excited using this wavelength
3) Measurement Quantum yields are measured for sample of solutions or films under nitrogen atmosphere. The yield is calculated using the equation:

$$\Phi_{PL} = \frac{n_{photon, \text{emited}}}{n_{photon, \text{absorbed}}} = \frac{\int \frac{\lambda}{hc}[Int_{emitted}^{sample}(\lambda) - Int_{absorbed}^{sample}(\lambda)]d\lambda}{\int \frac{\lambda}{hc}[Int_{emitted}^{reference}(\lambda) - Int_{absorbed}^{reference}(\lambda)]d\lambda}$$

wherein $n_{photon}$ denotes the photon count and Int. is the intensity.

Production and Characterization of Organic Electroluminescence Devices

Via vacuum-deposition methods OLED devices comprising organic molecules according to the invention can be produced. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT97 to the time point, at which the measured luminance decreased to 97% of the initial luminance etc.

Accelerated lifetime measurements are performed (e.g. applying increased current densities). Exemplarily LT80 values at 500 cd/m² are determined using the following equation:

$$LT80\left(500\frac{cd^2}{m^2}\right) = LT80(L_0)\left(\frac{L}{500\frac{cd^2}{m^2}}\right)^{1.6}$$

wherein $L_0$ denotes the initial luminance at the applied current density.

The values correspond to the average of several pixels (typically two to eight), the standard deviation between these pixels is given. Figures show the data series for one OLED pixel.

Examples D1 and D2 and Comparative Examples C$_1$

TADF1

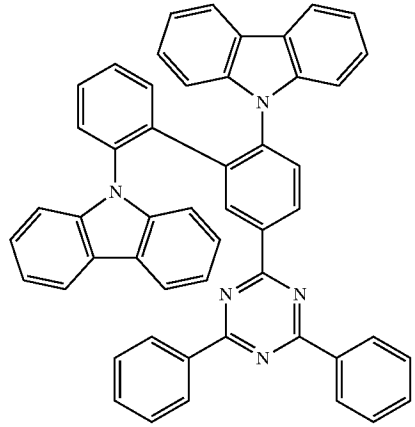

MAT1

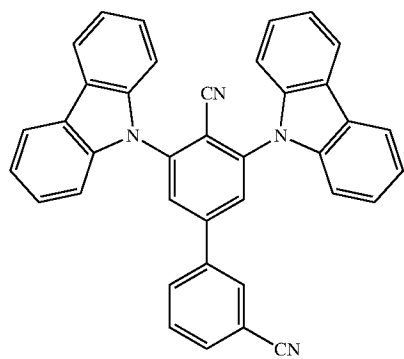

MAT2

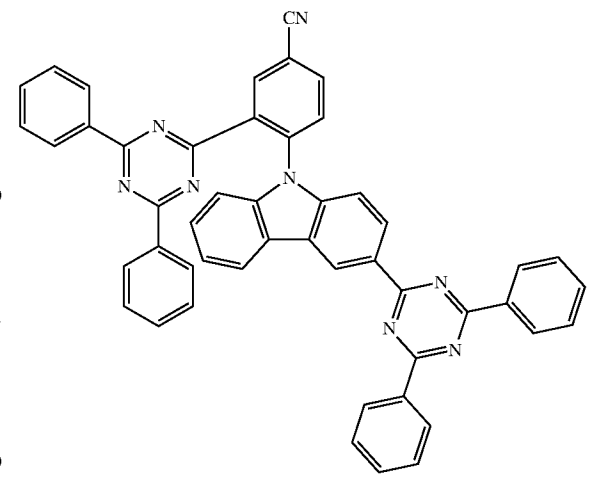

HBL1

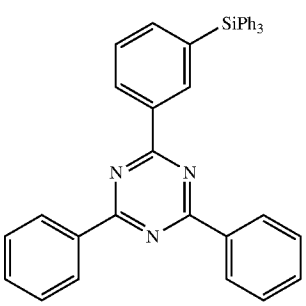

| | $\lambda_{max}^{PMMA}$ [nm] | HOMO [eV] | LUMO [eV] | S1 [eV] | T1 [eV] |
|---|---|---|---|---|---|
| mCBP | | −6.02 | −2.34 | 3.60 | 2.95 |
| TADF1 | 469 | −5.81 | −2.86 | | 2.94 |
| MAT1 | 450 | −6.14 | −3.11 | 3.03 | 2.75 |
| MAT2 | 465 | −6.16 | −3.16 | 2.94 | 2.83 |

| Layer | Thickness | D1 | D2 | C2 |
|---|---|---|---|---|
| 10 | 100 nm | Al | Al | Al |
| 9 | 2 nm | Liq | Liq | Liq |
| 8 | 20 nm | NBPhen | NBPhen | NBPhen |
| 7 | 10 nm | HBL1 | HBL1 | HBL1 |
| 6 | 50 nm | TADF1 (20%): MAT1 (5%): mCBP (75%) | TADF1 (20%): MAT2 (5%): mCBP (75%) | TADF1 (20%): mCBP (80%) |
| 5 | 10 nm | mCBP | mCBP | mCBP |
| 4 | 10 nm | TCTA | TCTA | TCTA |
| 3 | 40 nm | NPB | NPB | NPB |
| 2 | 5 nm | HAT-CN | HAT-CN | HAT-CN |
| 1 | 50 nm | ITO | ITO | ITO |
| substrate | | glass | glass | glass |

Device D1 yielded an external quantum efficiency (EQE) at 1000 cd/m$^2$ of 15.4±0.5%. The LT80 value at 500 cd/m$^2$ was determined to be 81 h from accelerated lifetime measurements. The emission maximum is at 472 nm with a FWHM of 67 nm at 10 mA/cm$^2$. The corresponding CIEy value is 0.24.

Device D2 yielded an external quantum efficiency (EQE) at 1000 cd/m$^2$ of 12.6±0.2%. The LT80 value at 500 cd/m$^2$ was determined to be 57 h from accelerated lifetime measurements. The emission maximum is at 471 nm with a FWHM of 67 nm at 10 mA/cm². The corresponding CIEy value is 0.25.

Comparative device C₁ comprises an emitting layer containing only TADF1 as emitter and mCBP as host material. The EQE at 1000 cd/m² is at 9.5±0.1%, thus lower than for D1 and D2 and the lifetime is significantly shorter (LT80 at 500 cd/m²=29 h). The emission maximum appears at 475 nm with a FWHM of 68 nm at 10 mA/cm². The corresponding CIEy value is 0.24.

What is claimed is:

1. An organic electroluminescent device comprising a light-emitting layer B comprising:
  (i) a first material $H^B$, which has a lowest unoccupied molecular orbital LUMO($H^B$) having an energy $E^{LUMO}(H^B)$ and a highest occupied molecular orbital HOMO ($H^B$) having an energy $E^{HOMO}(H^B)$;
  (ii) a second material $E^B$, which has a lowermost excited singlet state energy level $S1^E$, a lowermost excited triplet state energy level $T1^E$, a lowest unoccupied molecular orbital LUMO($E^B$) having an energy $E^{LUMO}(E^B)$ and a highest occupied molecular orbital HOMO ($E^B$) having an energy $E^{HOMO}(E^B)$; and
  (iii) a third material $S^B$, which has a lowermost excited singlet state energy level $S1^S$, a lowermost excited triplet state energy level $T1^S$, a lowest unoccupied molecular orbital LUMO($S^B$) having an energy $E^{LUMO}(S^B)$ and a highest occupied molecular orbital HOMO ($S^B$) having an energy $E^{HOMO}(S^B)$,
  wherein the relations expressed by the following formulas (1) to (2) and either (3a) and (5a) or (4a) and (5b) apply:

$$S1^S \geq S1^E \tag{1}$$

$$T1^S \geq 2.5 \text{ eV} \tag{2}$$

$$E^{LUMO}(E^B) < E^{LUMO}(H^B) \tag{3a}$$

$$E^{HOMO}(E^B) > E^{HOMO}(H^B) \tag{5a}$$

$$E^{LUMO}(E^B) > E^{LUMO}(H^B) \tag{4a}$$

$$E^{HOMO}(E^B) < E^{HOMO}(H^B) \tag{5b}$$

wherein the mass ratio of second material $E^B$ to a third material $S^B$ ($E^B$: $S^B$) is >1, and the light-emitting layer B emits light with CIEy color coordinate of between 0.01 and 0.30.

2. The organic electroluminescent device according to claim 1,
  the second material $E^B$ is characterized in that it has a $\Delta E_{ST}$ value, which corresponds to the energy difference between $S1^E$ and $T1^E$, of less than 0.4 eV, and/or
  the third material $S^B$ is characterized in that it has a $\Delta E_{ST}$ value, which corresponds to the energy difference between $S1^S$ and $T1^S$, of less than 0.4 eV.

3. The organic electroluminescent device according to claim 1, the light-emitting layer B emits light with CIEx color coordinate of between 0.02 and 0.30.

4. The organic electroluminescent device according to claim 1, wherein at least one of the first material $H^B$, the second material $E^B$ and the third material $S^B$ comprises a carbazole moiety.

5. The organic electroluminescent device according to claim 1, wherein each of the first material $H^B$, the second material $E^B$ and the third material $S^B$ comprises a carbazole moiety.

6. The organic electroluminescent device according to claim 1, the light-emitting layer B further comprises a fourth material $H^{B2}$ differing from the first material $H^B$.

7. The organic electroluminescent device according to claim 1, wherein the relation expressed by the following formula (6) applies:

$$E^{HOMO}(S^B) < E^{HOMO}(H^B) \tag{6}$$

8. The organic electroluminescent device according to claim 1, wherein said organic electroluminescent device is a device selected from the group consisting of an organic light emitting diode, a light emitting electrochemical cell, and a light-emitting transistor.

9. An organic electroluminescent device comprising a light-emitting layer B comprising:
  (i) a first material $H^B$, which has a lowest unoccupied molecular orbital LUMO($H^B$) having an energy $E^{LUMO}(H^B)$ and a highest occupied molecular orbital HOMO ($H^B$) having an energy $E^{HOMO}(H^B)$;
  (ii) a second material $E^B$, which has a lowermost excited singlet state energy level $S1^E$, a lowermost excited triplet state energy level $T1^E$, a lowest unoccupied molecular orbital LUMO($E^B$) having an energy $E^{LUMO}(E^B)$ and a highest occupied molecular orbital HOMO ($E^B$) having an energy $E^{HOMO}(E^B)$; and
  (iii) a third material $S^B$, which has a lowermost excited singlet state energy level $S1^S$, a lowermost excited triplet state energy level $T1^S$, a lowest unoccupied molecular orbital LUMO($S^B$) having an energy $E^{LUMO}(S^B)$ and a highest occupied molecular orbital HOMO ($S^B$) having an energy $E^{HOMO}(S^B)$,
  wherein the relations expressed by the following formulas (1) to (2) and either (3a) and (5a) or (4a) and (5b) apply:

$$S1^S \geq S1^E \tag{1}$$

$$T1^S \geq 2.5 \text{ eV} \tag{2}$$

$$E^{LUMO}(E^B) < E^{LUMO}(H^B) \tag{3a}$$

$$E^{HOMO}(E^B) > E^{HOMO}(H^B) \tag{5a}$$

$$E^{LUMO}(E^B) > E^{LUMO}(H^B) \tag{4a}$$

$$E^{HOMO}(E^B) < E^{HOMO}(H^B) \tag{5b},$$

wherein the mass ratio of second material $E^B$ to a third material $S^B$ ($E^B$: $S^B$) is >1, and wherein the device exhibits an emission maximum $\lambda_{max}$ (D) of 440 to 480 nm.

10. An organic electroluminescent device comprising a light-emitting layer B comprising:
  (i) a first material $H^B$, which has a lowest unoccupied molecular orbital LUMO($H^B$) having an energy $E^{LUMO}(H^B)$ and a highest occupied molecular orbital HOMO ($H^B$) having an energy $E^{HOMO}(H^B)$;
  (ii) a second material $E^B$, which has a lowermost excited singlet state energy level $S1^E$, a lowermost excited triplet state energy level $T1^E$, a lowest unoccupied molecular orbital LUMO($E^B$) having an energy $E^{LUMO}(E^B)$ and a highest occupied molecular orbital HOMO ($E^B$) having an energy $E^{HOMO}(E^B)$;
  (iii) a third material $S^B$, which has a lowermost excited singlet state energy level $S1^S$, a lowermost excited triplet state energy level $T1^S$ a lowest unoccupied molecular orbital LUMO($S^B$) having an energy $E^{LUMO}(S^B)$ and a highest occupied molecular orbital HOMO ($S^B$) having an energy $E^{HOMO}(S^B)$; and (iv) a fourth material $H^{B2}$ differing from the first material $H^B$, which has a lowest unoccupied molecular orbital LUMO($H^{B2}$) having an energy $E^{LUMO}(H^{B2})$ and a highest occupied molecular orbital HOMO($H^{B2}$) having an energy $E^{HOMO}(H^{B2})$;

wherein the relations expressed by the following formulas (1), (2), (7a) and (7b) apply:

$$S1^S \geq S1^E \quad (1)$$

$$T1^S \geq 2.5 \text{ eV} \quad (2)$$

$$E^{HOMO}(E^B) - E^{HOMO}(H^B) \leq 0.3 \text{ eV and } E^{HOMO}(E^B) - E^{HOMO}(H^B) \geq -0.3 \text{ eV} \quad (7a)$$

$$E^{LUMO}(E^B) - E^{LUMO}(H^{B2}) \leq 0.4 \text{ eV and } E^{LUMO}(E^B) - E^{LUMO}(H^{B2}) \geq -0.4 \text{ eV} \quad (7b).$$

11. The organic electroluminescent device according to claim 10, wherein the first material $H^B$ comprises a carbazole moiety.

12. The organic electroluminescent device according to claim 10, wherein the first material $H^B$ is a hole-dominant host and the fourth material $H^{B2}$ is an electron-dominant host.

13. The organic electroluminescent device according to claim 10, wherein the device exhibits an external quantum efficiency at 1000 cd/m² of more than 10% and/or exhibits an emission maximum $\lambda_{max}$ (D) of 440 to 480 nm.

14. The organic electroluminescent device according to claim 10, wherein the relation expressed by the following formulas (3a) and (3b) or (4a) and (4b) apply:

$$E^{LUMO}(E^B) < E^{LUMO}(H^B) \quad (3a)$$

$$0.2 \text{ eV} < E^{LUMO}(E^B) - E^{LUMO}(S^B) < 0.5 \text{ eV} \quad (3b)$$

$$E^{LUMO}(E^B) > E^{LUMO}(H^B) \quad (4a)$$

$$2 \text{ eV} < E^{LUMO}(H^B) - E^{LUMO}(S^B) < 0.5 \text{ eV} \quad (4b).$$

15. The organic electroluminescent device according to claim 10, the second material $E^B$ is characterized in that it has a $\Delta E_{ST}$ value, which corresponds to the energy difference between $S1^E$ and $T1^E$, of less than 0.4 eV, and/or the third material $S^B$ is characterized in that it has a $\Delta E_{ST}$ value, which corresponds to the energy difference between $S1^S$ and $T1^S$, of less than 0.4 eV.

16. The organic electroluminescent device according to claim 10, wherein the relation expressed by the following formula (6) applies:

$$E^{HOMO}(S^B) < E^{HOMO}(H^B) \quad (6).$$

17. The organic electroluminescent device according to claim 10, the device further comprises one or more protective layers.

18. The organic electroluminescent device according to claim 10, the device emits light with a FWHM of the main emission peak of below 0.50 eV.

19. The organic electroluminescent device according to claim 10, wherein said organic electroluminescent device is a device selected from the group consisting of an organic light emitting diode, a light emitting electrochemical cell, and a light-emitting transistor.

\* \* \* \* \*